US005600658A

United States Patent [19]
Qureshi

[11] Patent Number: 5,600,658
[45] Date of Patent: Feb. 4, 1997

[54] BUILT-IN SELF TESTS FOR LARGE MULTIPLIER, ADDER, OR SUBTRACTOR

[75] Inventor: Fazal U. R. Qureshi, Cupertino, Calif.

[73] Assignee: National Semiconductor Corporation, Santa Clara, Calif.

[21] Appl. No.: 545,509

[22] Filed: Oct. 19, 1995

[51] Int. Cl.$^6$ .......................... G06F 11/22; G06F 11/263
[52] U.S. Cl. .......................... 371/22.1; 371/27; 371/25.1
[58] Field of Search .............................. 371/22.1, 24, 26, 371/25.1, 27; 364/200, 900

[56] References Cited

U.S. PATENT DOCUMENTS 4,866,715  9/1989  Van Meerbergen et al. .............. 371/27

OTHER PUBLICATIONS

Sung Je Hong; The Design of testable parallel Multiplier; IEEE Trans. on computer, vol. 39, No. 3, Mar. 1990.

Fikri T. Assaad and Shantanu Dutt; More Robust tests in Algorithm-based Fault-Toleratn Matrix Multiplication; IEEE Intl. Symposium; 1992.

D. Gizopoulos, D. Nikolos, A. Paschalis, P. Kostarakis; C-Testable Multipliers based on the Modified Booth Algorithm; Asian Test Symposium 1994.

Farookh Moogat, Raymond Sifered; A 60 Mhz Asic Bit serial/parallel Multiplier; Asic conference and Exhibit; 1994.

Primary Examiner—Robert W. Beausoliel, Jr.
Assistant Examiner—Nadeem Iqbal
Attorney, Agent, or Firm—Limbach & Limbach L.L.P.

[57] ABSTRACT

A method of testing a two-input multiplier, adder, or subtractor implementation for stuck-at faults includes a multi-step procedure for iteratively exercising all input and output permutations, and pseudo-exhaustively exercising all internal nodes. The method of testing a multiplier, adder, or subtractor involves logically partitioning the multiplication, addition, or subtraction into several smaller but identical independent operations. This logical partitioning of operations ensures that the output result will consist of several smaller identical results if the unit under test is functioning properly. Because the several smaller results are identical, comparing the smaller results to each other detects any failures internal to the multiplier, adder, or subtractor under test. The logically partitioned operations are repeated for multiple input setting to ensure a high level of fault coverage. In the testing of a multiplier, a four step iterative method fully exercises the multiplier. Each step includes iteratively filling alternate digits of one input operand with a first test value and filling the remaining digits of that operand with zero. Each step further includes the filling of one digit of the other multiplier operand with a second test value, while all remaining digits of that operand are filled with zero. Four different fill patterns are used for all permutations of the two test digits to fully exercise the multiplier. In the testing of an adder or subtractor, a two step iterative method fully exercises the adder or subtractor.

61 Claims, 19 Drawing Sheets

| A | B | C | D | Z | Z |
|---|---|---|---|---|---|
| 0 | 0 | 0 | 0 | 0 | 0 |
| 0 | 0 | 0 | 1 | 0 | 0 |
| 0 | 0 | 1 | 0 | 0 | 0 |
| 0 | 0 | 1 | 1 | 1 | 0 |
| 0 | 1 | 0 | 0 | 0 | 0 |
| 0 | 1 | 0 | 1 | 0 | 0 |
| 0 | 1 | 1 | 0 | 0 | 0 |
| 0 | 1 | 1 | 1 | 1 | 0 |
| 1 | 0 | 0 | 0 | 0 | 0 |
| 1 | 0 | 0 | 1 | 0 | 0 |
| 1 | 0 | 1 | 0 | 0 | 0 |
| 1 | 0 | 1 | 1 | 1 | 0 |
| 1 | 1 | 0 | 0 | 1 | 1 |
| 1 | 1 | 0 | 1 | 1 | 1 |
| 1 | 1 | 1 | 0 | 1 | 1 |
| 1 | 1 | 1 | 1 | 1 | 1 |

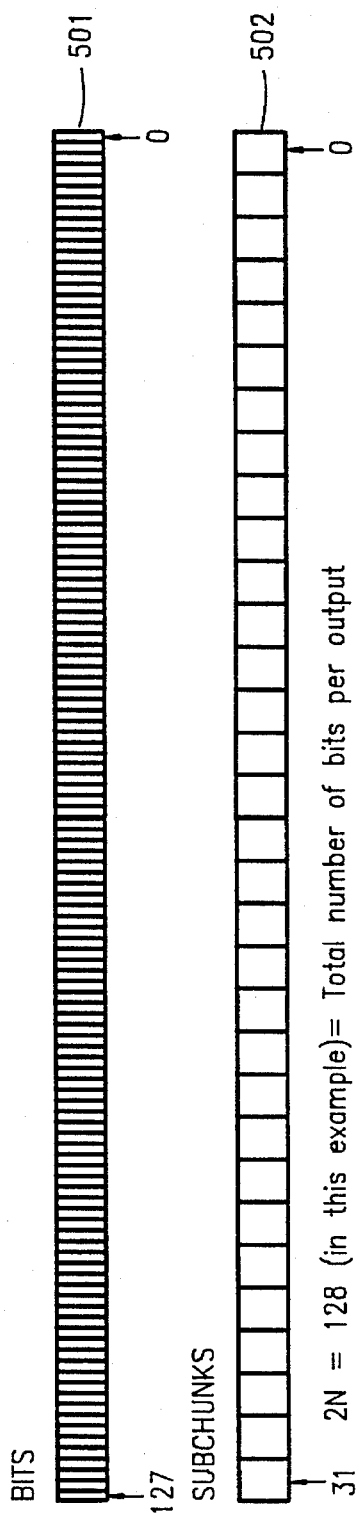
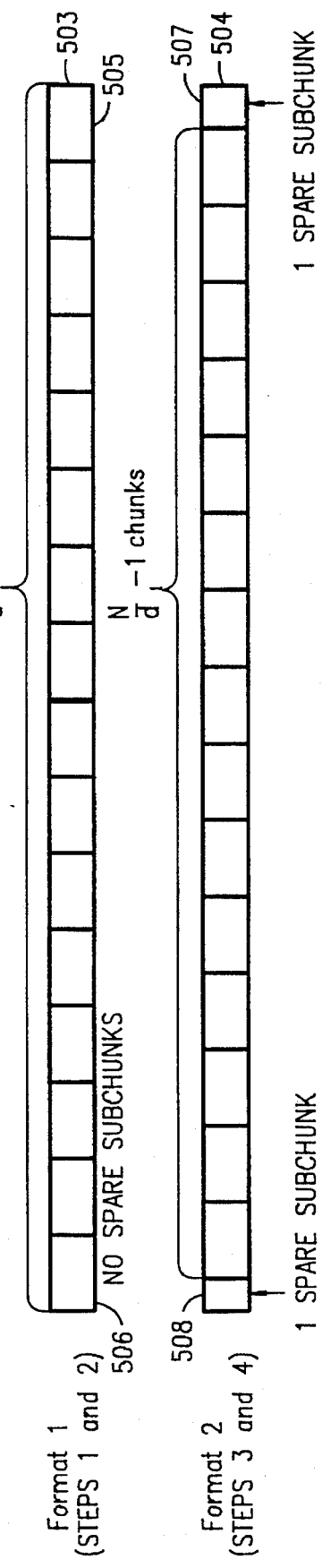

FIG. 5

MULTIPLIER OUTPUT DATA FORMATS $2N = 128$ (in this example) = Total number of bits per output $\frac{2N}{d} = 32$ (in this example) = Total number of subchunks per output Number represented = $\sum_{X=0}^{2N-1} 2^x \cdot (x\underline{^{th}}\text{bit value}) = \sum_{X=0}^{\frac{2N}{d}-1} 2^{dx} \cdot (x\underline{^{th}}\text{subchunk value})$ 2 subchunks per chunk → Two Chunk Formats Format 1 (STEPS 1 and 2) — NO SPARE SUBCHUNKS Format 2 (STEPS 3 and 4) — 1 SPARE SUBCHUNK

BUILT-IN SELF TESTS FOR LARGE MULTIPLIER, ADDER, OR SUBTRACTOR

BACKGROUND OF THE INVENTION

1. Field of the Invention

The present invention relates to the testing of integrated circuits and, in particular, to a built in self test (BIST) technique for determining the existence of "stuck at faults" in multiplier, adder, or subtractor implementations by pseudo-exhaustively exercising all permutations of inputs and outputs. The technique is scalable to any size.

2. Discussion of the Related Art

In a production testing environment, the testing of semiconductor devices is performed to separate good devices from bad devices. Data collected from a test program may be used for yield enhancement. This is done by finding marginal areas of the device design or in the fabrication process and then making improvements to raise yields and therefore lower cost. The basis for all testing of complex integrated circuits is the comparison of known correct output patterns to the response of a device under test. The simulation of the device design is typically done with input stimuli which fully exercise the design and therefore verify the correctness of the design. After fabrication of the design, often the same stimuli (also called test vectors) are presented to each device under test to separate good devices from defective devices. Comparisons are made cycle by cycle with an option to ignore certain pins, times, or patterns. If the device response and the expected response are not in agreement, the devices are usually considered defective.

Built-In Self-Testing (BIST) is the implementation of logic built into the circuitry to do testing without the use of an external tester for pattern generation and comparison purposes. An external tester is still needed to categorize failures and to separate good units from bad units. In this case, the external tester supplies clocks to the device and determines pass/fail from the outputs of the device. The test vectors are generated and input to the device under test, and a resulting signature is generated. The signature can be a simple pass or fail signal presented on one pin of the part, or the signal may be a polynomial generated during the self-testing. Usually, if a polynomial is used, it has some significance to the actual states of the part.

Self-testing capability can be implemented on virtually any size logic block. However, there are tradeoffs between the extra logic added to implement the self-testing capability and the inherent logic of the block to be tested. Often, the self-test logic adds not only extra hardware to the design, but also adds latency to the logic block having the self-test even under normal operations.

Many Built In Self Test (BIST) arrangements deal with embedded memory structures like Random Access Memories (RAMs). These arrangements usually tend to be implementation dependent and have rather complicated arrangements for generating data and predicting failures. In many cases, a signature is collected for analysis after a series of stimuli has been applied to the block being tested. Many BIST arrangements do not have the flexibility to be implemented with either software alone or hardware alone or a mixture of both. FIG. 2 depicts a typical self-test circuit. The logic block under test 201 has N independent logic inputs. An N-bit counter sequentially steps through all $2^N$ unique input permutations. However, if it is desired for the self-test time to be less than about one second, N is typically limited to about twenty. The logic block under test has M output bits. An M-bit flip-flop 203 latches the output of after the first set of stimuli have been applied. Each subsequent M-bit output of the logic block is exclusive ORed with the contents of the flip-flop 203 such that at the end of the self-test, an M-bit signature is available as the output of the flip-flop 203. An exclusive OR 204 or exclusive NOR function is typically used because the its output value is always dependent upon all of the inputs. Therefore, if any single output of the logic block under test is incorrect, the final signature will be incorrect. (In contrast, a two-input AND function, for example, does not produce the same input-output dependence. For example, if one input of the AND function is zero, then the value of the other input does not influence the output at all.)

Direct access testing is alternative to direct access testing whereby an external tester gains access to a device logic block by bringing signals from the block to the outside world via multiplexors. Input test vectors are directly supplied to the logic block by the external tester, and then the outputs are directly measured by the tester. This is one of the simplest methods for checking devices for logical functionality. Often, direct access testing supplements previous testing methods by allowing the user to impose input data patterns directly on large blocks of logic which would not otherwise be directly accessible. Using direct access testing, entering a special test mode would force certain logic blocks via multiplexors to gain access to the outside pins of the part, and to measure the access, status, and logical functionality of the block directly.

Fault grading is a measure of test coverage of a given set of stimuli and responses for a given circuit. This figure of merit is used to ensure that the device is fully testable and measurable. Typically, once the test patterns are developed for the device, artificial faults are put into the design via simulation to ensure that the part is fully testable and observable.

A "stuck-at fault" may be caused by a variety of conditions, although the defining characteristic of a stuck-at fault is that a circuit node is undesirably immovable from certain logic value (either zero or one) regardless of any circuit conditions. FIG. 1 illustrates a single stuck-at-one fault 104 injected into a simple logic circuit with an exhaustive set of input data patterns for fully checking the functionality of the logic circuit. Even though the stuck-at-one fault 104 exists at an internal node which is not directly observable, the stuck-at-one fault 104 shows up on at the output Z of the circuit. Gaining high fault coverage is a very desirable method for ensuring that the tested devices will function correctly in a system. Ideally, all internal nodes should be tested for stuck-at-zero and stuck-at-one faults.

Although fault grading using single stuck-at-zero and single-stuck-at-one faults covers many types of semiconductor failures, it does not cover all of them. For example, bridging faults and intermittent faults are two other common types of faults which occur in semiconductor devices.

Data patterns that were generated during simulation are often converted into a functional production test program. The cost of production testing is very much related to test time per device. In production, package handlers, wafer probe equipment, people, and often a computer network are needed to run production tests.

One effective way to test a circuit 100 for single stuck-at faults is to exhaustively check all outputs of the circuit for correctness for all possible input permutations. For the circuit shown in FIG. 1, this is a relatively straightforward procedure which requires only sixteen separate operations of the circuit. In general, for a circuit having N inputs, $2^N$ operations of the circuit are required to exhaustively test the circuit using all possible input permutations. This is feasible for smaller circuits; however, because the number of input permutations increases exponentially with N, exhaustively testing all $2^N$ input permutations becomes prohibitively time consuming.

As feature sizes for semiconductor manufacturing processes become smaller, bus widths become larger. Thirty-two and sixty-four bit internal busses are commonplace today. Similarly, the widths of the arithmetic units and mathematical functions become larger. Hardware multipliers, dividers, square root modules, adders, and subtractors supporting thirty-two and sixty-four-bit operands currently are available.

Moreover, in the field of cryptography, there is demand for specialized hardware to support asymmetric encryption/decryption algorithms such as the RSA algorithm. (See, for example, U.S. Pat. No. 4,405,829 for a description of the RSA algorithm.) Such encryption algorithms typically require many multiplications of very large numbers. If very large multipliers are implemented in hardware, the testing of those multipliers offers significant challenges. For example, if it is assumed that a multiplication requires 1 nanosecond regardless of the size of the operands (a generously low estimate), an exhaustive test of a 8-bit multiplier requires only 65.5 microseconds, an exhaustive test of a 16-bit multiplier requires only 4.3 seconds, but an exhaustive test of a 32-bit multiplier would require about 584.9 years, while an exhaustive test of a 256-bit multiplier would require about $10^{146.6}$ years. This is approximately $10^{136.6}$ times greater than the estimated age of the universe (assuming that the age of the universe is 10 billion years). This demonstrates that an exhaustive test of mathematical functions in a manner such as shown in FIG. 1 is totally infeasible.

It is clear from the above discussion that there is a need for testing semiconductor circuits implementing math functions such that all internal nodes are checked for stuck-at faults without performing an exhaustive test of all possible input permutations.

SUMMARY OF THE INVENTION

One object of the present invention is to provide a method of exhaustively testing a multiplier, an adder, or a subtractor for stuck-at faults without exhaustively sequencing through all permutations of inputs. Another object of the present invention is to provide a scalable method of testing a multiplier, an adder, or a subtractor such that stuck-at faults can be located in a fixed number of steps regardless of the size of the multiplier, adder, or subtractor.

The methods of performing built-in self tests according to the present invention are used to determine if there are any "stuck at faults" in large multipliers, adders, or subtractors by pseudo-exhaustively exercising all permutations of inputs and outputs. The methods are scalable to any size and are applied to a multiplier, an adder, and a subtractor.

The built-in self-test capability according to the present invention can be invoked at any time, for example, by the user setting a self-test control bit. Setting the self-test control bit will cause the built-in self test operation to be executed a cycle after the control bit is set. If at any time during the built-in self test, the self-test detects an error, an error status bit will be set. The end of the self-test operation is indicated by an interrupt being issued. The user, which may be a test program or a production tester, can then determine if the self-test was successful by interrogating the status register containing the status bit and checking whether or not the error status bit is set. If the error bit set is set, a flaw has been detected.

The implementations of the built-in self-test methods according to the present invention are highly flexible. For example, a total hardware solution, a total software solution, or a solution using a mixture of hardware and software can be utilized to implement the built-in self-test according to the present invention. The method of testing a multiplier, an adder, or a subtractor according to the present invention is to logically partition the operation into several smaller but identical independent operations. This logical partitioning of operations ensures that the result will consist of several smaller identical results if the unit under test is functioning properly. Because the several smaller results are identical, comparing them to each other is an effective way to detect a failure internal to the multiplier, adder, or subtractor. The logically partitioned operations are repeated for multiple input setting to ensure a high level of fault coverage.

In the pure software solution, software writes the input operands A and B with selected bit-fill arrangements and then issues a multiplication, addition, or subtraction instruction. At the end of each multiplication, addition, or subtraction cycle, the software checks the result. A pure software solution is only feasible when the inputs and outputs of the multiplier, adder, or subtractor are accessible from outside the device. In order to achieve high fault coverage for testing a multiplier, four distinct Steps are performed to complete the self-test. To test a multiplier, one operand is filled with an alternating pattern of zero digits and a unique digit value, while the other operand is filled with one second unique digit value and a series of zeros.

After all four Steps of the multiplication self-test have been completed, for every digit in the result of each multiplication, the sum and the carries into and out of that digit are being tested. Additionally, all inputs and outputs of the multiplier, and in fact all permutations, have been exercised and as such the test is pseudo-exhaustive. The resulting test time using a pure software implementation will be high but there is no silicon cost.

An alternative implementation involves the use of a mixture of hardware and software. In this implementation, the unique inputs permutations are generated by a hardware counter and are provided to the input operands into the appropriate digit positions using a multiplexor network. The resulting output is checked externally by software. This implementation is suitable when the inputs to the multiplier, adder, or subtractor are not writeable from outside the integrated circuit while the outputs are readable by external hardware or software.

Another alternative implementation involves use of hardware to generate and properly allocate the inputs while the outputs are also compared using hardware comparison logic. This implementation is necessary when neither the inputs nor the outputs of the multiplier or adder are accessible by external hardware or software.

According to the preferred embodiments of the methods of the present invention, a Johnson counter is used to provide the input data permutations in order to minimize time to failure in the case that the unit being tested is faulty.

These and other features and aspects of the present invention will be apparent from the Figures as fully discussed in the Detailed Description of the Invention.

BRIEF DESCRIPTION OF THE DRAWINGS

FIG. 5 illustrates output data formats and definitions used in the description of the methods of testing a multiplier according to the present invention.

The Figures are more fully explained in the Detailed Description of the Invention.

DETAILED DESCRIPTION OF THE INVENTION

Figure 1:
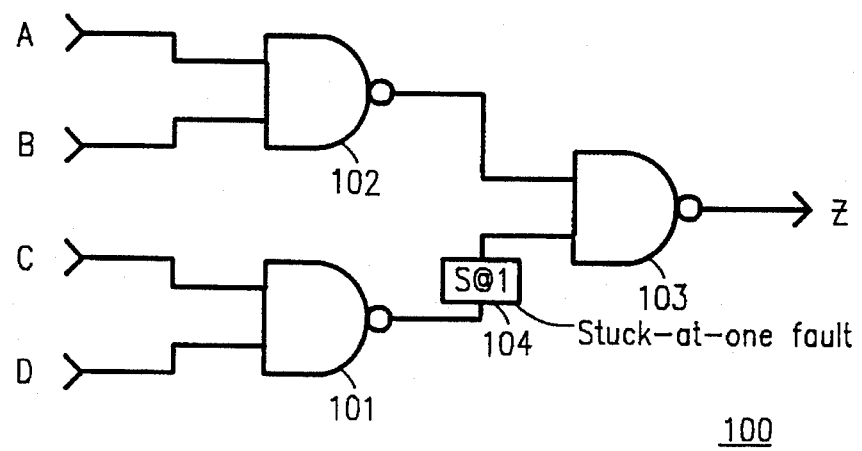
FIG. 1 illustrates a simple (faulty) logic circuit having a stuck-at-one fault, and the expected and observed outputs of the faulty logic circuit for all possible input permutations.
Figure 2:
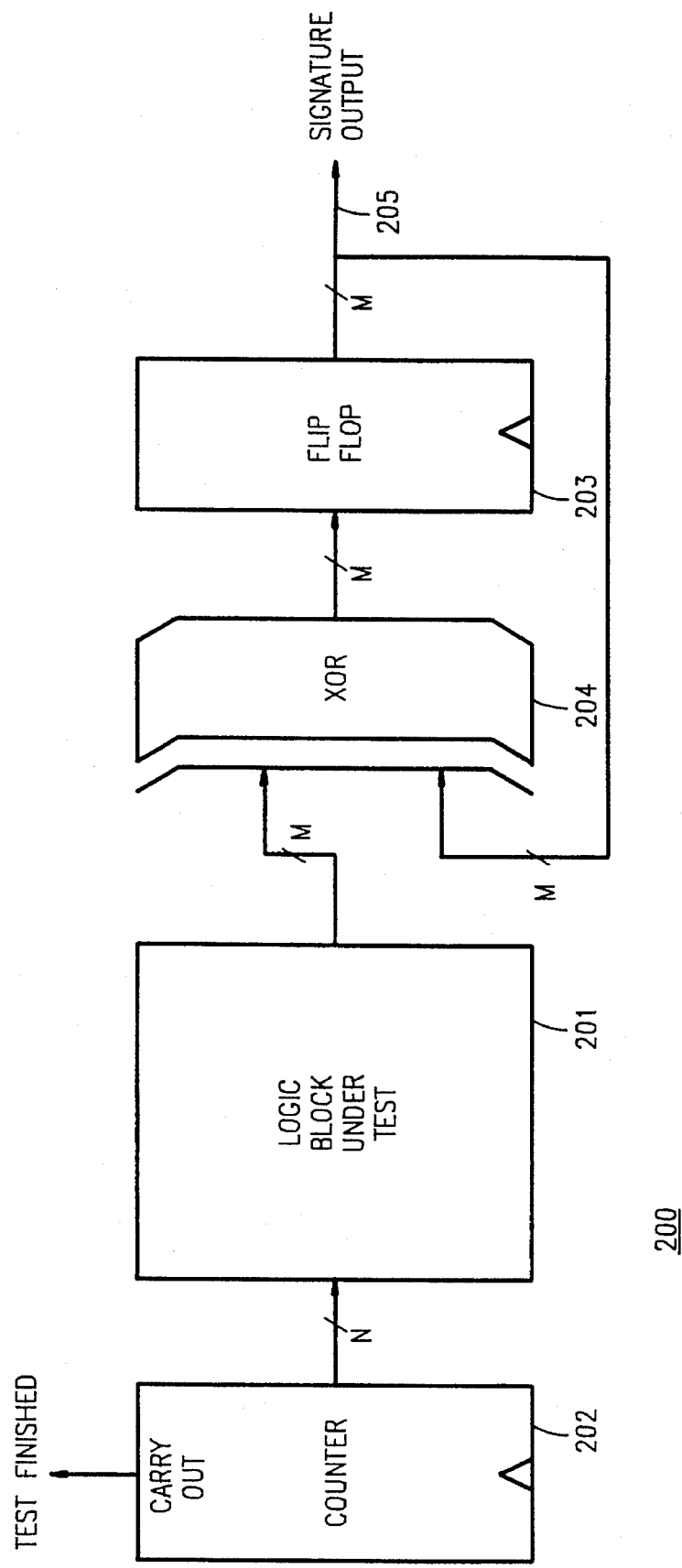
FIG. 2 is a simplified logic diagram of a conventional built in self test circuit in which a counter sequences through all possible input permutations and in which a digital signature output is accumulated and generated.
Figure 3A:
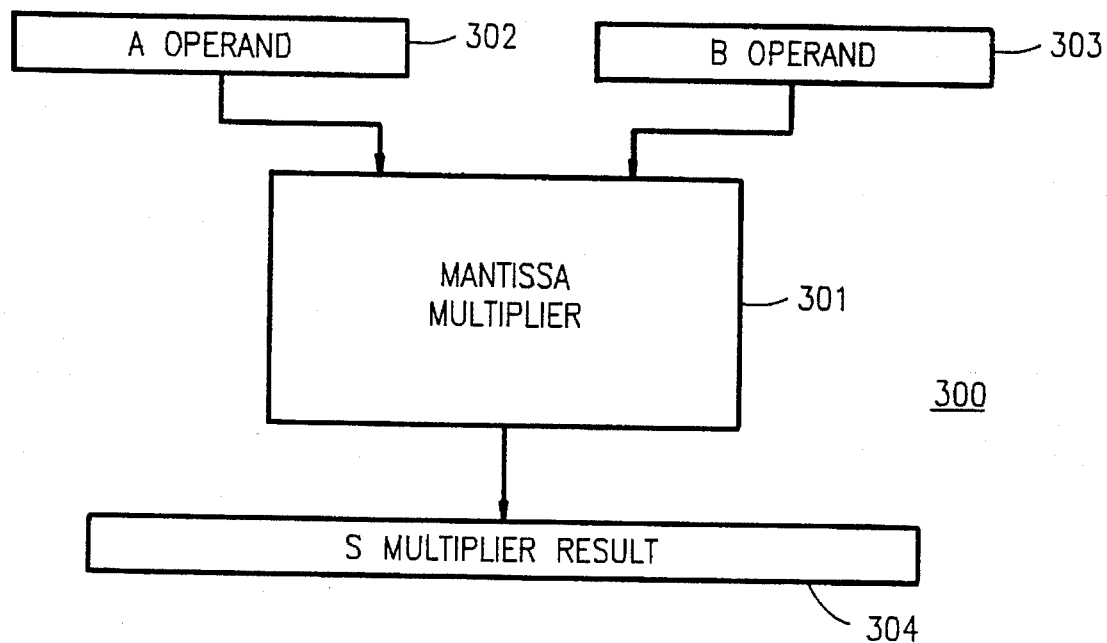
FIG. 3A illustrates a mantissa multiplier suitable for testing using the methods of the present invention.

FIG. 3A is a simple block diagram describing the unit to be tested according to a first embodiment of the present invention. A standard mantissa multiplier unit 301 takes two operands, A 302 and B 303. The two operands A and B are multiplied together by the mantissa multiplier 301 to form a multiplier result S 304.

The mantissa multiplier tested according to the present invention maintains all the precision and resolution of both operands. The result is that the final multiplier result S 304 has twice as many digits as the two operands A and B each have. This is in distinct contrast to many standard multipliers in which the multiplier result S 304 is rounded or truncated to include the same number of digits as the operands A and B. For example, in floating point operations, often both operands A and B have a certain fixed number of mantissa bits, and the multiplier result S has the same number of mantissa bits as the operands, such that the least significant half of the multiplication result is truncated or rounded.

The multiplier tested according to the present invention does not perform any truncation or rounding but rather outputs the entire exact result of the multiplication of operand A 302 and operands B 303. The mantissa multiplier tested according to the present invention does not require or include an exponent unit and thus is not necessarily a floating point multiplier. Operands A 302 and B 303 are not necessarily normalized, and the result is not necessarily normal either.

It is necessary to maintain the entire resolution of the mantissa output for certain integer mathematics which rely on exact results. For example, in the field of cryptography, every least significant digit of the final multiplier output is critical to correct encryption or decryption. In many asymmetric encryption techniques, a very large multiplier result is generated by a series of multiplications of smaller numbers. The very large multiplier result is divided by a modulus, and the remainder of that division is the encrypted or decrypted message. Since deriving the correct remainder is dependent upon all the least significant digits of the multiplier result S being preserved, the results of the multiplier must be exact.

Figure 3B:
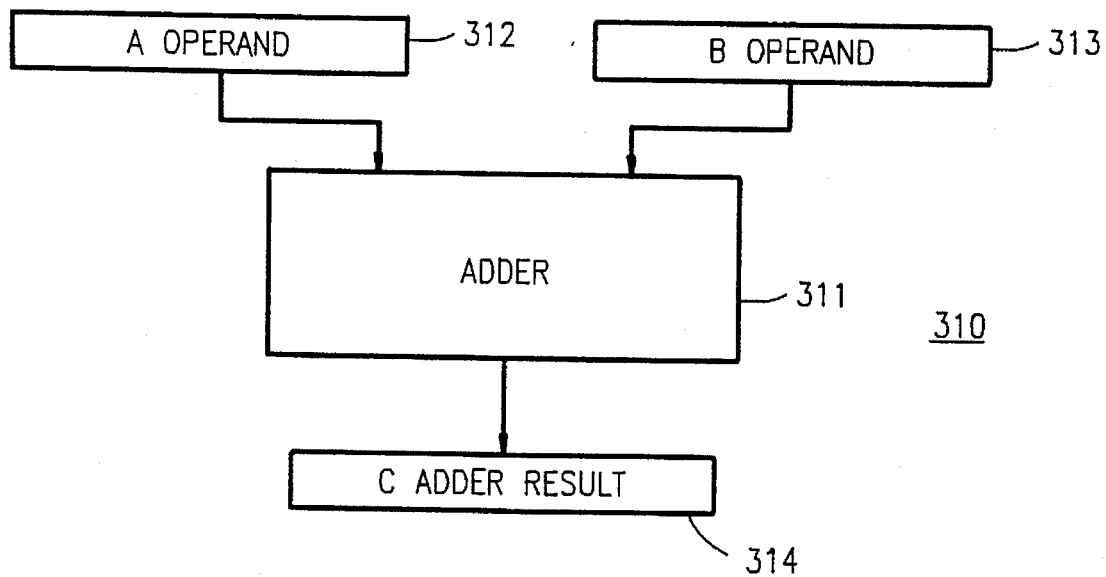
FIG. 3B illustrates an adder suitable for testing using the methods of the present invention.

FIG. 3B illustrates an adder which can be tested according to the methods of the present invention as well. Operand A 312 and operand B 313 are added together by an adder unit 311 to create an adder result C 314. No rounding or truncation occurs in the computation of the adder result. The adder result 314 has the same number of digits as each of the operands 312 and 313.

Figure 4:
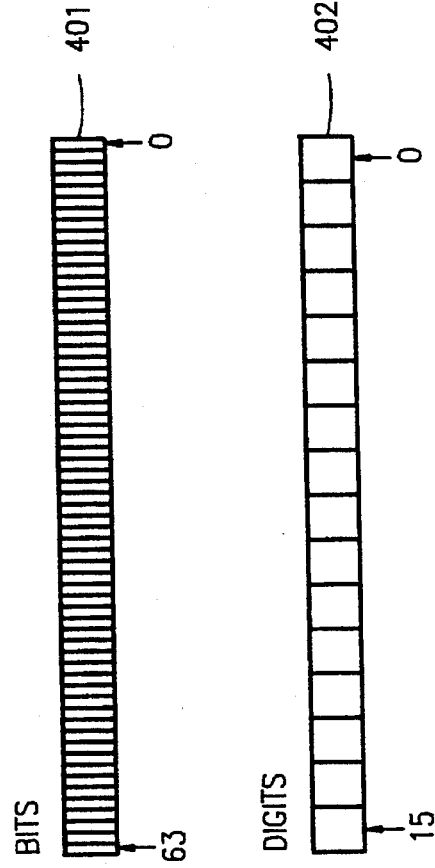
FIG. 4 illustrates input operand data formats and definitions used in the description of the methods of testing a multiplier and an adder according to the present invention.

FIGS. 4 and 5 are provided mainly for definitional purposes so as to introduce the terminology used in the claims and in the rest of the specification.

FIG. 4 illustrates the input data formats for the methods of testing of a multiplier or an adder according to the present invention. Both a multiplier and an adder have the same input data format as illustrated by the element 401 which is a example of a possible input to either a multiplier or an adder. As illustrated in FIG. 4, an input operand A or B 401 has N bits (binary digits). In the example illustrated by the operand 401, N is 64 such that the least significant bit is designated bit 0 while the most significant bit is designated bit N−1, which is 63 in this example.

Frequently, the size of the input operands for a multiplier or an adder will be some power of 2. In this case, 64 is 2 to the sixth power. However, there is no requirement that the number of bits in each input is a power of 2. In other words, N can be any integer, even a prime number if desired. For the sake of this illustration, however, N is 64. The same input operand is illustrated again as operand 402 which is broken into N/d digits. In the example of FIG. 4, d is 4 and is the number of bits per digit; thus, N/d is 16 in the example of FIG. 4, and N/d is the number of digits per input operand. The digits shown by operand 402 are numbered from 0 which is the least significant digit to 15, which is the most significant digit. Operand 401 and operand 402 are alternative views of the same standard encoded base 2 number. The number represented is shown in the last line of FIG. 4.

FIG. 5 illustrates the output data format of a multiplier. In the example of FIG. 5 (which is consistent with the example FIG. 4), the output 501 has 2N bits or 128 total bits in the output as illustrated by the view 502 in which the output 502 is divided into 2N/d subchunks. Each subchunk has d bits. Similarly, the output 502 is a standard base 2 encoded number representation as illustrated by the equations in FIG. 5. The outputs of a multiplier can be thought of existing in two formats according to the present invention. Format 1, illustrated as output 503 in FIG. 5, includes N/d chunks. Each chunk consists of two subchunks. In the output 503 illustrated in FIG. 5, the N/d chunks are aligned so that the least significant chunk's least significant bit is the least significant bit of the output. Similarly, the most significant chunk's most significant bit is the most significant bit of the output 503. Therefore, the most significant bit of the most significant chunk 506 is the same as bit 127 of the output view 501, and the least significant bit of the least significant chunk 505 is bit 0 of output view 501. This conceptual definition and organization of the output bits into subchunks and chunks is useful in describing the method of testing a multiplier according to the present invention as will be seen below. The conceptual partitioning of the inputs and outputs into the various fields described in the specification is referred to as "allocation" in the claims.

A second format illustrated in FIG. 5 for the outputs of a multiplier is illustrated as output view 504 which is also organized into chunks. However, the output view 504 includes only N/d−1 chunks. This is a consequence of the fact that the chunks are not aligned along the least significant subchunk of the output. The least significant subchunk 507 is not included in any of the N/d−1 chunks of output view 504. Similarly, the most significant subchunk 508 is not included in any of the N/d−1 chunks. The result of this partitioning is that the boundaries between the chunks of output view 503 according to Format 1 and output view 504 according to Format 2 are not aligned. Instead, the boundaries of the chunks according to Format 1 occur in the middle of the chunks according to Format 2, and the boundaries of the chunks according to Format 2 occur of middle of the chunks in Format 1.

Figure 6:
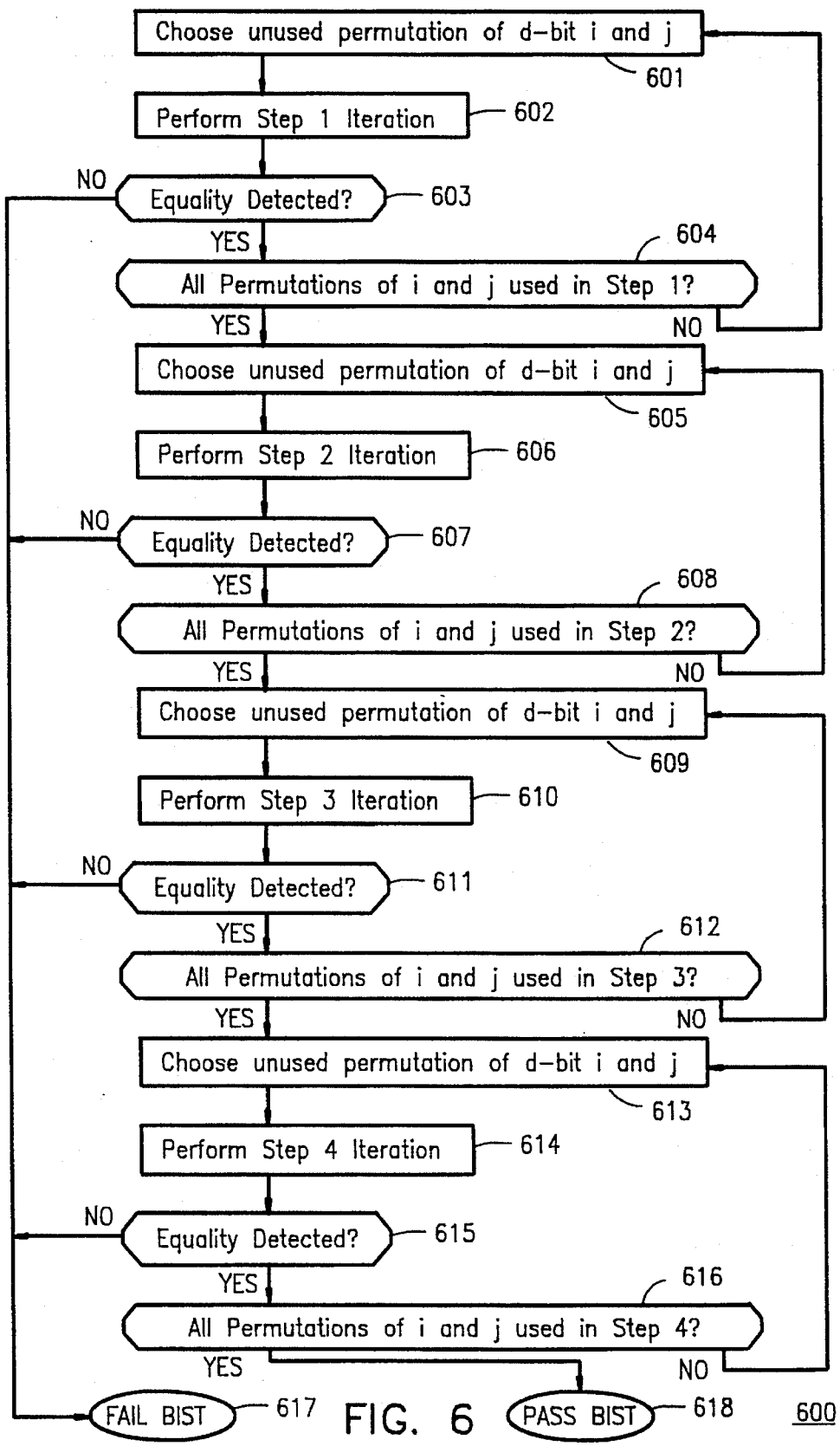
FIG. 6 is a flowchart illustrating a method of testing a multiplier according to the first embodiment of the present invention.

FIGS. 6 through 10 illustrate the method according to the present invention of testing a multiplier which produces a mantissa output having twice as many significant digits as each of its inputs as illustrated in FIG. 3A. FIG. 6 is a flowchart illustrating a four step method according to the present invention of fully testing a multiplier. FIGS. 7,8, 9, and 10 are flowchart illustrations (including examples) of some of the more complex steps of the method shown in FIG. 6. Therefore, FIG. 6 can be viewed as a top level flowchart while FIGS. 7, 8, 9, and 10 can be viewed as lower level flowcharts of several of the steps shown in FIG. 6.

The method 600 shown in FIG. 6 begins with choosing an unused permutation of a d-bit i and j at step 601. Typically, during the first iteration, the permutation will be i=0 and j=0 if an monotonically increasing counter is used to generate the permutations. However, there is no restriction that i and j be 0 during the first pass. At step 602, a Step 1 iteration is performed.

Figure 7:
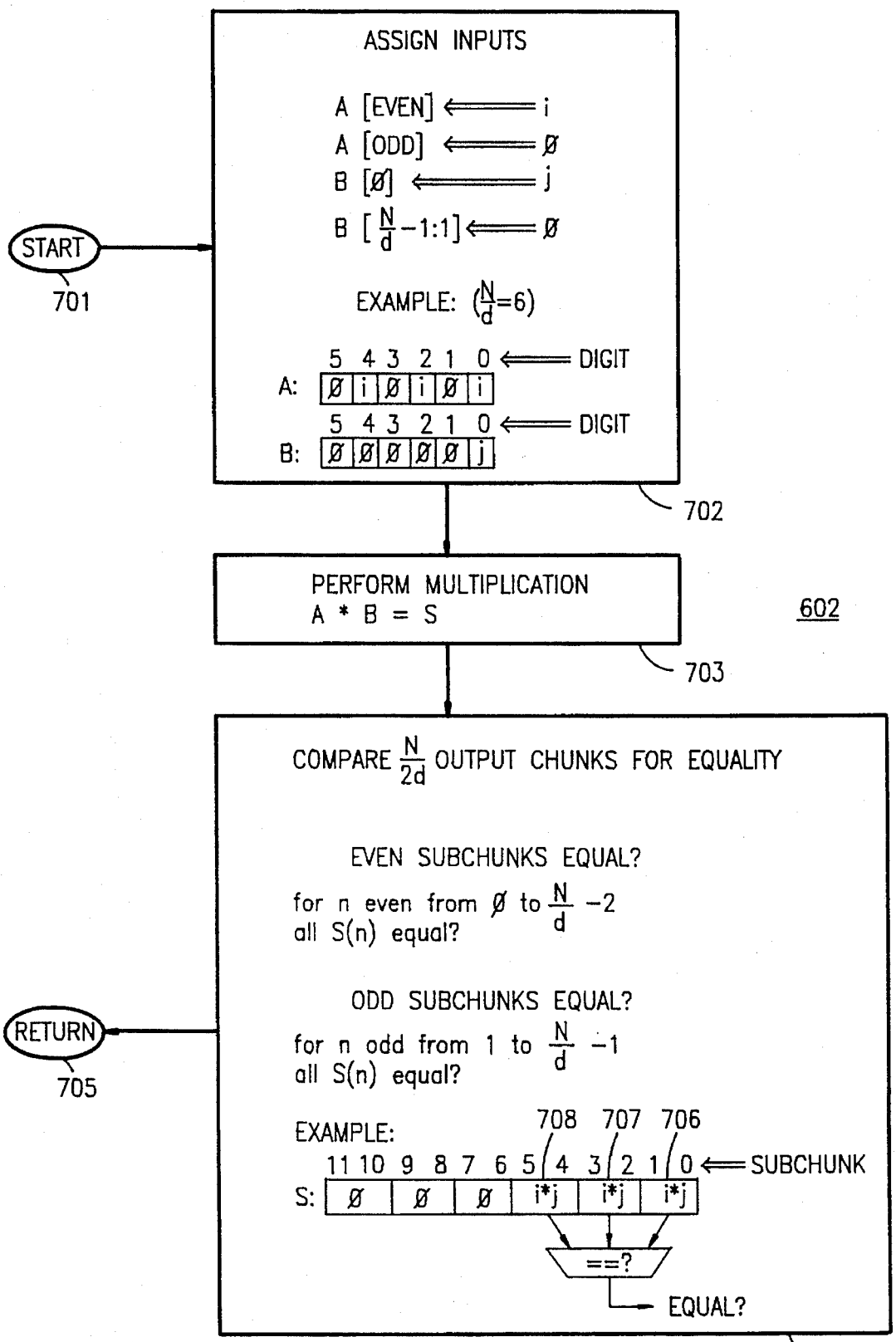
FIG. 7 is a flowchart illustrating the execution of a Step 1 iteration in the testing of a multiplier according to the first embodiment of the present invention.

FIG. 7 illustrates what constitutes a Step 1 iteration 602. The Step 1 iteration begins at step 701, and operands A and B are assigned their respective values at step 702. FIG. 7 includes an N/d =6 example of the resulting operands A and B for an iteration of Step 1. As illustrated in FIG. 7, the even digits of operand A are assigned the value of i which was chosen in step 601. In the example shown in FIG. 7 in which there are six digits per operand, the result is that digits 0, 2, and 4 are assigned the value of i which was chosen in step 601. In step 702, the odd digits of operand A are assigned a value of all zeros in the six digit example shown in FIG. 7. This means that digits 1, 3, and 5 are assigned values of zero. In step 702, operand B is also assigned its respective values. The least significant digit (digit 0) of operand B is assigned the value of j which was chosen in step 601. All other digits of operand B, digits N/d−1 through digit 1 are filled with zeros.

Once the operands A and B have been assigned their respective values in steps 702, the flow then proceeds to step 703, and the multiplier being tested performs its multiplication such that the number represented by operand A is multiplied by the number represented by operand B resulting in a number S having twice as many digits as each of operands A and B.

Now that the output result S has been computed in step 703, the flow proceeds to step 704 where some of the output chunks are tested for equality with each other. In the example shown in step 704 of FIG. 7, the output S has 12 subchunks; thus, it has six chunks since each chunk consists of two subchunks. As discussed with respect to FIG. 5, the output view 503 of Format 1 exists for Steps 1 and 2. Since FIG. 7 illustrates a Step 1 iteration, the subchunks are aligned along the least significant bit boundary and the most significant bit boundary of the output as illustrated in FIG. 7.

In Step 704, chunks 706, 707, and 708 are compared for equality. Each of the chunks 706, 707, and 708 should be equal to each other and should be equal to the product of the test values i and j which were selected in step 601. If each of the chunks 706, 707, and 708 are equal, then the corresponding subchunks within those chunks will be equal. Even subchunks 0, 2, and 4 will be equal to each other while the more significant subchunks 1, 3, and 5 within each chunk will also be equal to each other. Step 704 will test the least significant half of the outputs of S. The most significant half of the outputs of S subchunks 6 through 11 will all be zero. Once equality or inequality has been determined in step 704, step 705 returns the flow to FIG. 6 at branch step 603.

In the case that step 704 detected inequality, branch step 603 directs the flow to reporting failure of the built in self test in step 617. Step 617 can consist of asserting a status bit indicating an error condition or terminating the test entirely but the final result is that the built-in self-test fails if branch 603 determines that inequality was found in step 704.

Branch step 604 tests whether or not all permutations of i and j have already been used in step 1. Since i and j are independent d bit variables, there are $2^{2d}$ unique permutations of i and j. If all permutations of i and j have not been used in step 1, then the branch 604 directs the flow back to step 601 where another unused permutation of i and j is selected. Then a Step 1 iteration at step 602 is performed again as described above. The loop through steps 601, 602,

603, and 604 continues until all permutations of i and j have been used in Step 1. Typically, since i and j are independent d bit variables this will require $2^{2d}$ iterations through that loop. If at any time step 603 detects inequality during any of those $2^{2d}$ iterations, then the built-in self-test reports failures at step 617.

If the loop through steps 601, 602, 603, and 604 are completed for all permutations of i and j, then the method proceeds to step 605. Steps 605, 607, and 608 are identical to steps 601, 603, and 604, respectively. However, the Step 2 iteration that occurs in step 606 is unique, and it is illustrated in FIG. 8.

Figure 8:
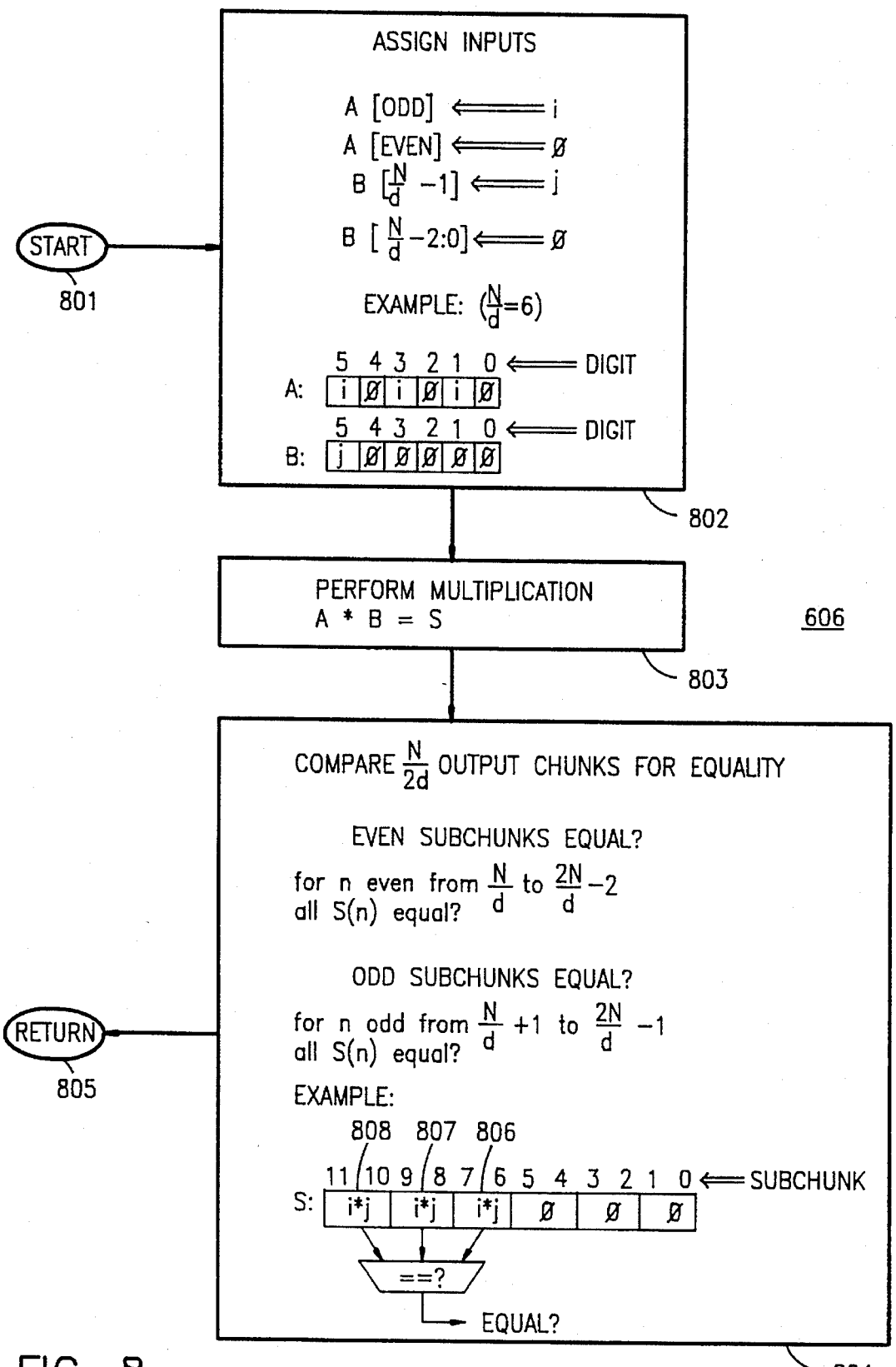
FIG. 8 is a flowchart illustrating the execution of a Step 2 iteration in the testing of a multiplier according to the first embodiment of the present invention.

In the beginning of the Step 2 iteration procedure shown in FIG. 8, which is invoked at step 801, inputs A and B are assigned at step 802. Inputs are assigned at step 802 in a different pattern than in a Step 1 iteration as shown in FIG. 7. In step 802, odd digits of operand A are assigned the test value of i selected in step 605 while even digits of A are assigned zero as illustrated in FIG. 8, step 802. The most significant digit of operand B is assigned the value of j selected in step 605. The less significant digits of operand B are assigned zero. Once all digits of operands A and B have been assigned in step 802, a multiplication is performed at step 803 such that the number represented by A and the number represented by B are multiplied together to produce the result S.

Once S becomes available some of the output chunks are once again compared for equality at step 804 as illustrated in FIG. 8. The most significant chunks 806, 807, and 808 of S are compared to each other for equality. Steps 609, 611, and 612 are identical to steps 605, 606, and 608. However, step 610 in which a Step 3 iteration is performed is unique from steps 602 or 606.

Figure 9:
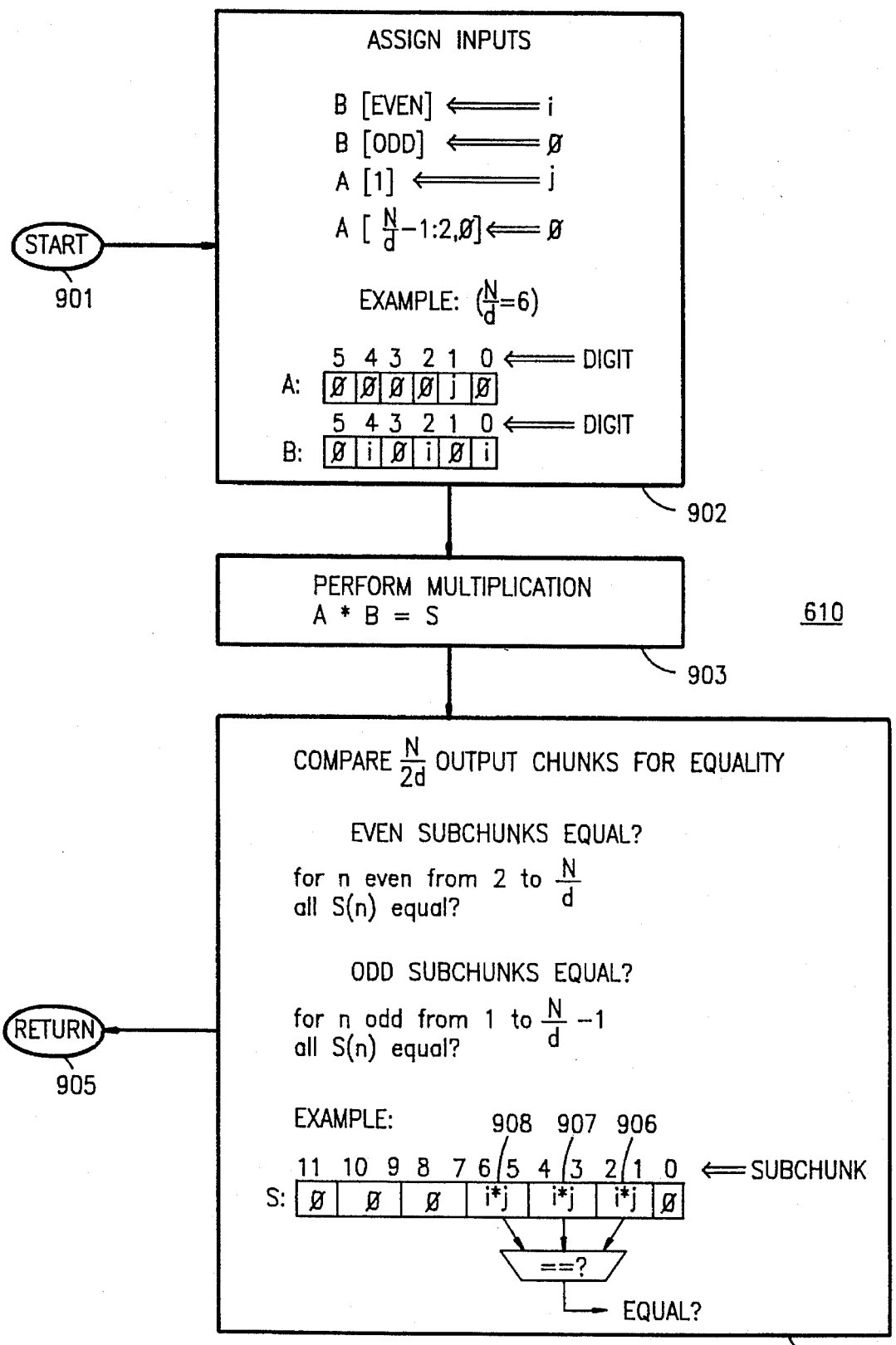
FIG. 9 is a flowchart illustrating the execution of a Step 3 iteration in the testing of a multiplier according to the first embodiment of the present invention.

A Step 3 iteration is illustrated in FIG. 9. In FIG. 9, once again the process is invoked at step 901, and inputs are assigned at step 902. The assignment pattern for step 902 is unique from that for either Steps 1 or 2. In a Step 3 iteration, the even digits of operand B are assigned the value of i which was chosen in step 609. As shown in the example of FIG. 9 at step 902, digits 0, 2, and 4 are assigned the chosen value of i while odd digits of operand B are assigned with zeros. Digits 1, 3, and 5 are filled with zeros in step 902. With respect to operand A, the second to the least significant digit is filled with the value chosen for j in step 609, while the more significant digits and the least significant digit are all filled with zeros. At step 903, a multiplication is performed, and then in step 904 half of the output subchunks are compared for equality.

As discussed with respect to FIG. 5, in the Format 2 which corresponds to Steps 3 and 4, the chunks are no longer aligned to the least significant bit of the output or to the most significant bit of the output as illustrated in FIG. 9 at step 904 in the example subchunk 0 is a spare subchunk. This spare subchunk corresponds to subchunk 507 shown in FIG. 5. Similarly, subchunk 11 is spare and corresponds to the subchunk 508 shown in FIG. 5. Note that in the FIG. 9 example shown at step 904, each of the chunks which are being compared consist of two subchunks, and the least significant subchunk of each chunk is an odd subchunk rather than an even subchunk, as had been the case in FIG. 7 and 8 corresponding to steps 1 and 2.

Figure 10:
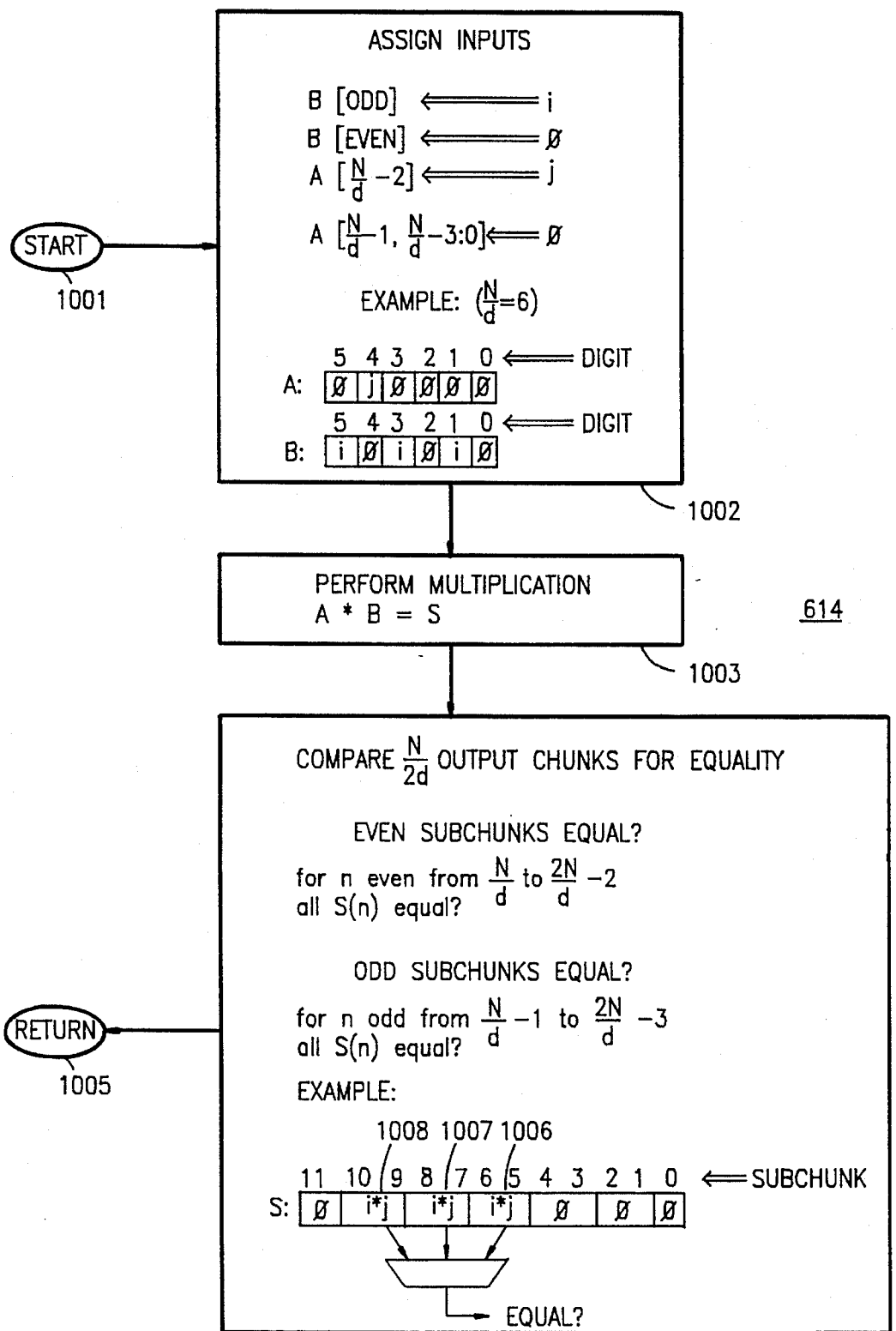
FIG. 10 is a flowchart illustrating the execution of a Step 4 iteration in the testing of a multiplier according to the first embodiment of the present invention.

Steps 613, 615, and 616 are identical to step 609, 611, and 612, respectively. However, the Step 4 iterations which are performed in step 614 are unique from the Step 1, Step 2, and Step 3 iterations performed in step 602, 606 and 610, respectively. The Step 4 iteration 614 is illustrated in FIG. 10. At Step 1002, odd digits of operand B are filled with the test value of i selected in step 613 while even digits of operand B are filled with 0. With respect to operand A in step 1002, the second to the most significant digit is filled with the value of j selected in step 613 while the most significant digit of A and the less significant digits of A are all filled with zero. Thus, operand A contains only one non-zero digit, that digit being the second to the most significant.

Once the operands are assigned at step 1003 a multiplication is performed such that the number represented by A and the number represented by operand B are multiplied together to produce an output S.

At step 1004, half of the output subchunks are once again compared for equality. Similarly to a Step 3 iteration which was illustrated in FIG. 9, as illustrated in FIG. 10 in the step 1004 example. In Step 4, the least significant subchunk and the most significant subchunk are not part of a output chunk and are spare subchunks and are equal to zero. The three most significant chunks 1006, 1007, and 1008 in the example of FIG. 10 are subchunks 5 and 6, 7 and 8, and 9 and 10, respectively. Each of these chunks consists of a pair of subchunks, are equal to each other, and are equal to i times j where i and j are selected in step 613 for that particular Step 4 iteration.

If all of the Step 1, Step 2, Step 3, and Step 4 loops are completed without inequality being detected at any of the comparisons steps, then the built in self test is deemed to have resulted in a pass condition, and the multiplier is fully verified as being fully functional at step 618.

While the above description has fully explained the procedure for the built in self test of a multiplier according to the method of present invention, it has not discussed why the comparisons shown in FIGS. 7, 8, 9, and 10 at steps 704, 804, 904, and 1004, respectively, will always result in a finding of equality if the hardware multiplier is functioning properly. Furthermore, the above discussion has not described why the multiplier output results are of the form shown in the examples included in steps 704, 804, 904, and 1004, respectively.

A Step 1 multiplier iteration, as illustrated in FIG. 7, is described by the following equations.

$$A = i \cdot 2^0 + i \cdot 2^{2d} + i \cdot 2^{4d} + \ldots + i \cdot 2^{N-4d} + i \cdot 2^{N-2d}$$

$$A = i \cdot \sum_{x=0}^{\frac{N}{2d}-1} 2^{2dx}$$

$$B = j \cdot 2^0 = j$$

$$A \cdot B = ij \sum_{x=0}^{\frac{N}{2d}-1} 2^{2dx}$$

$$A \cdot B = ij2^0 + ij2^{2d} + \ldots + ij2^{N-4d} + ij2^{N-2d}$$

$$i < 2^d, j < 2^d, ij < 2^{2d}$$

The first and second equations above are equivalent representations of operand A as illustrated in step 702. The third equation is a representation of operand B as illustrated in step 702. The fourth and fifth equations are equivalent representations of the output of the multiplier under test as illustrated in step 704. The final set of inequalities proves that the non-zero output chunks 706, 707, and 708 shown in step 704 can be fully represented by 2d bits and do have carries which extend into the next more significant chunk.

A Step 2 multiplier iteration, as illustrated in FIG. 8, is described by the following equations.

$$A = i \cdot 2^d + i \cdot 2^{3d} + i \cdot 2^{5d} \ldots + i \cdot 2^{N-3d} + i \cdot 2^{N-d}$$

$$A = i \cdot \sum_{x=0}^{\frac{N}{2d}-1} 2^{(2x+1)d}$$

$$B = j \cdot 2^{N-d}$$

$$A \cdot B = ij \sum_{x=0}^{\frac{N}{2d}-1} 2^{2dx+N}$$

$$A \cdot B = ij2^N + ij2^{2d+N} + \ldots + ij2^{2N-4d} + ij2^{2N-2d}$$

$$i < 2^d, j < 2^d, ij < 2^{2d}$$

The first and second equations shown above are equivalent representations of operand A as illustrated in step 802. The third equation is a representation of operand B as illustrated in step 802. The fourth and fifth equations are equivalent representations of the output of the multiplier under test as illustrated in step 804. The final set of inequalities proves that the non-zero output chunks 806, 807, and 808 shown in step 804 can be fully represented by 2d bits and do have carries which extend into the next more significant chunk.

A Step 3 multiplier iteration, as illustrated in FIG. 9, is described by the following equations.

$$A = j \cdot 2^d$$

$$B = i \cdot \sum_{x=0}^{\frac{N}{2d}-1} 2^{2dx}$$

$$A \cdot B = ij \sum_{x=0}^{\frac{N}{2d}-1} 2^{(2x+1)d}$$

$$ij < 2^{2d}$$

The first equation shown is a representation of operand A as illustrated in step 902. The second equation is a representation of operand B as illustrated in step 902. The third equation shown above is a representation of the output of the multiplier under test as illustrated in step 904. The final inequality proves that the non-zero output chunks 906, 907, and 908 shown in step 904 can be fully represented by 2d bits and do have carries which extend into the next more significant chunk.

A Step 4 multiplier iteration, as illustrated in FIG. 10, is described by the following equations.

$$A = j2^{N-2d}$$

$$B = i \cdot \sum_{x=0}^{\frac{N}{2d}-1} 2^{(2x+1)d}$$

$$A \cdot B = ij \sum_{x=0}^{\frac{N}{2d}-1} 2^{(2x-1)d+N}$$

$$ij < 2^{2d}$$

The first equation shown is a representation of operand A as illustrated in step 1002. The second equation is a representation of operand B as illustrated in step 1002. The third equation shown above is a representation of the output of the multiplier under test as illustrated in step 1004. The final inequality proves that the non-zero output chunks 1006, 1007, and 1008 shown in step 1004 can be fully represented by 2d bits and do have carries which extend into the next more significant chunk.

The table below shows which inputs and which outputs are tested for each of the four steps of the multiplier test according to the present invention. In the table below, the input and output bits are represented by the number that the bit encodes. For example, the least significant input bit is represented as $2^0$, while the most significant output bit is represented as $2^{2N-1}$.

| | Inputs Tested | Outputs Tested |
|---|---|---|
| STEP 1 | A: for n from 0 to $\frac{N}{2d} - 1$<br>$2^{2nd}$ thru $2^{(2n+1)d-1}$<br>B: $2^0$ thru $2^{d-1}$ | $2^0$ thru $2^{N-1}$ |
| STEP 2 | A: for n from 0 to $\frac{N}{2d} - 1$<br>$2^{(2n+1)d}$ thru $2^{(2n+2)d-1}$<br>B: $2^{N-d}$ thru $2^{N-1}$ | $2^N$ thru $2^{2N-1}$ |
| STEP 3 | A: $2^d$ thru $2^{2d-1}$<br>B: for n from 0 to $\frac{N}{2d} - 1$<br>$2^{2nd}$ thru $2^{(2n+1)d-1}$ | $2^d$ thru $2^{N+d-1}$ |
| STEP 4 | A: $2^{N-2d}$ thru $2^{N-d-1}$<br>B: for n from 0 to $\frac{N}{2d} - 1$<br>$2^{(2n+1)d}$ thru $2^{(2n+2)d-1}$ | $2^{N-d}$ thru $2^{2N-d-1}$ |

The table below includes a column entitled "Carries Not Tested", which shows which carries within the non-zero output chunks are not tested by the given Step. The carries not tested are the carries along the non-zero chunk boundaries for each Step. The table below also includes a column entitled "Carries Tested", which shows the carries which were not tested by another Step which are tested by the given Step. Careful inspection of the above table illustrates that the carries not tested in Step 1 are tested in Step 3. Similarly, the carries not tested in Step 3 are tested in Step 1. Steps 1 and 3 deal with the least significant half of outputs. The most significant half of the outputs are tested by Steps 2 and 4. The carries not tested by Step 2 are tested by Step 4. Conversely, the carries not tested by Step 4 are tested by Step 2.

| | Carries Not Tested | Carries Tested |
|---|---|---|
| STEP 1 | For n from 1 to $\frac{N}{2d}$<br>$2^{2dn-1}$ into $2^{2dn}$ | For n from 0 to $\frac{N}{2d} - 1$<br>$2^{(2n+1)d-1}$ into $2^{(2n+1)d}$ |
| STEP 2 | For n from 1 to $\frac{N}{2d}$<br>$2^{2dn+N-1}$ into $2^{2dn+N}$ | For n from 0 to $\frac{N}{2d} - 1$<br>$2^{(2n+1)d+N-1}$ into $2^{(2n+1)d+N}$ |
| STEP 3 | For n from 1 to $\frac{N}{2d}$<br>$2^{(2n+1)d-1}$ into $2^{(2n+1)d}$ | For n from 0 to $\frac{N}{2d} - 1$<br>$2^{(2n+2)d+1}$ into $2^{(2n+2)d}$ |
| STEP 4 | For n from 1 to $\frac{N}{2d}$<br>$2^{(2n-1)d-1}$ into $2^{(2n-1)d}$ | For n from 0 to $\frac{N}{2d} - 1$<br>$2^{2nd+N-1}$ into $2^{2nd+N}$ |

The method of testing a multiplier according to present invention described above reduces the number of multiplications from $2^{2N}$ to $2^{2(d+1)}$. In the application for which the method was developed, this results in a reduction from $2^{512}$ multiplications to $2^{10}$ multiplications.

Figure 11:
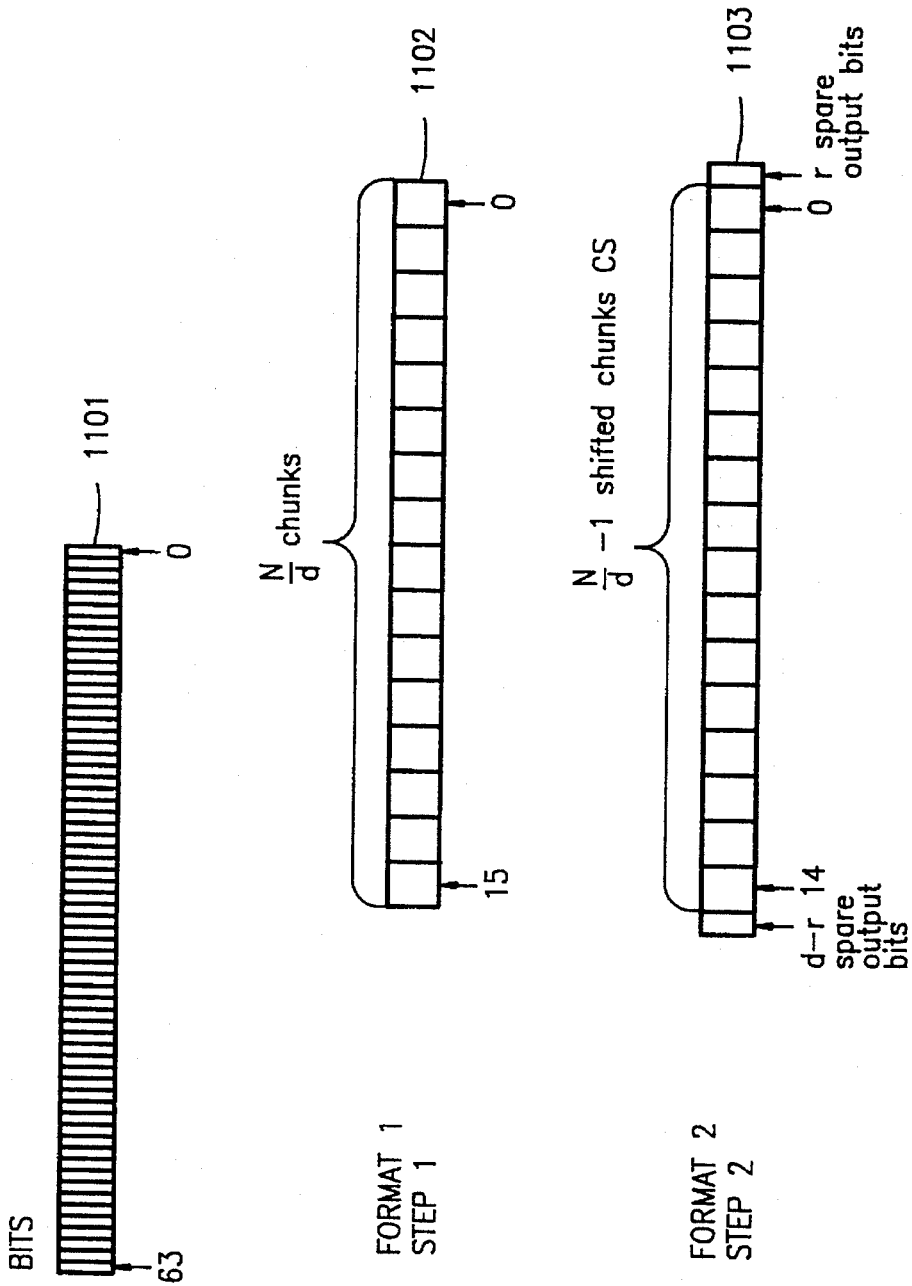
FIG. 11 illustrates output data formats and definitions used in the description of the methods of testing an adder according to the first embodiment of the present invention.

The method of testing an adder according to the present invention is described in conjunction with FIGS. 11, 12, 13, and 14. FIG. 11 illustrates the output format and definitions for an adder. The input format for the operands A 312 and B 313 (illustrated in FIG. 3B) is the same as that shown in FIG. 4. As illustrated in FIG. 11, the output data format 1101 for an adder includes only N bits, the same number of bits as operands A and B. The method of testing an adder according to the present invention involves the use of two testing steps. Format 1 of the adder output is illustrated as an alternative view 1102 of the adder output organized into N/d chunks. In the example shown in FIG. 11, the total number of output bits N is 64, the number of bits d per digit is. In Format 1 of the output of step 1, there are N/d output chunks with no spare bits, such that the output is aligned along the least significant bit 0 and most significant bit 63 of the output. In Format 1, there are 16 output chunks numbered 0 to N/d−1.

According to Format 2, the output chunks are organized such that there are r spare least significant output bit fields of the adder. Similarly, there are d-r spare most significant output bits of the output bits of the adder output 1103. The existence of the spare output bits eliminates one of the output chunks. Therefore, there are only N/d−1 shifted output chunks CS. The value of r is typically chosen to be in the range of 1 to d−1.

Figure 12:
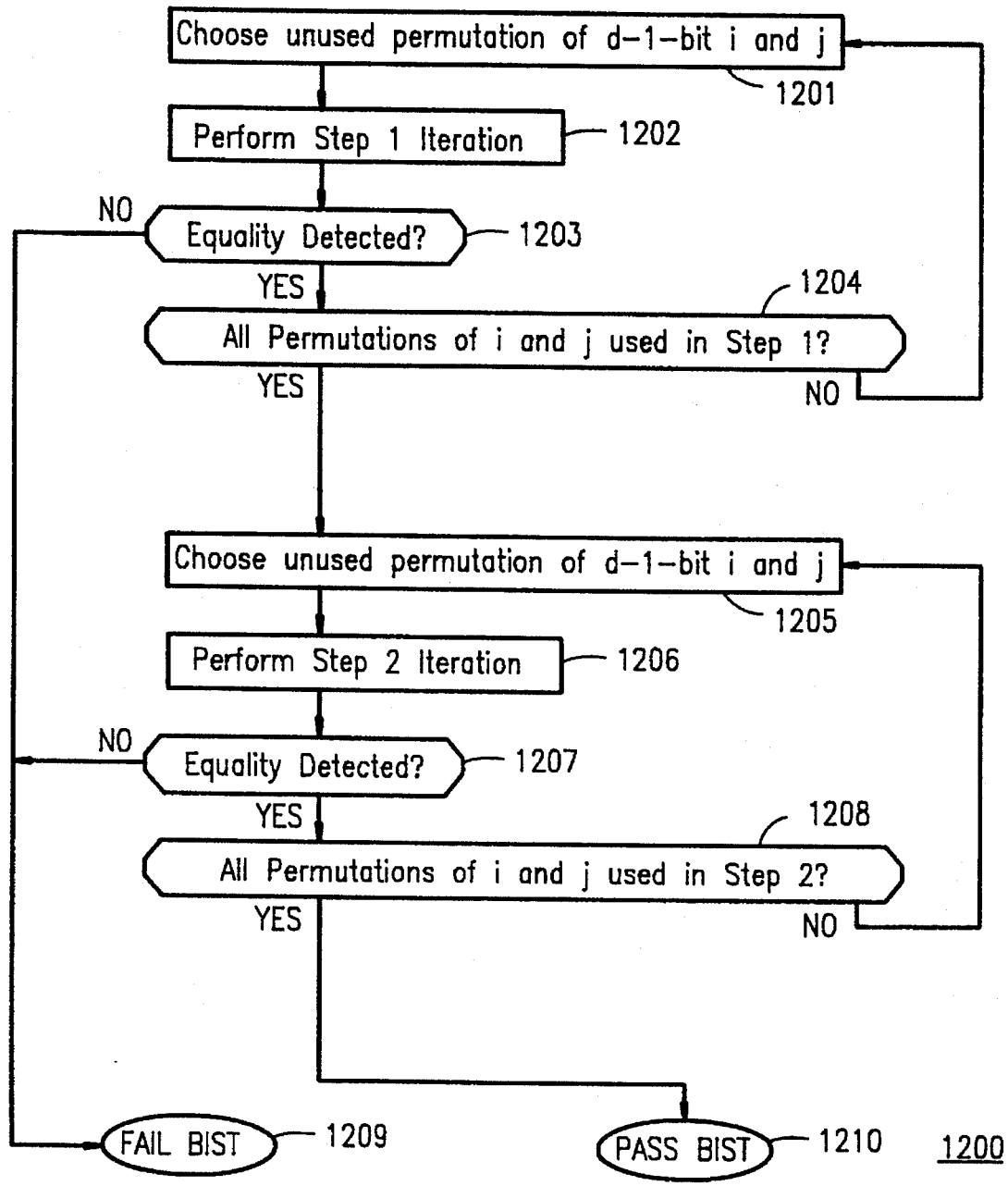
FIG. 12 is a flowchart illustrating the method of testing an adder according to the first embodiment of the present invention.

FIG. 12 is a flowchart illustrating the method of testing an adder according to the present invention. Similarly to the testing of the multiplier, the testing of an adder involves the use of two test values i and j which will be sequenced through all unique permutations. In the testing of an adder according to the present invention, there are only d−1 bits per input digit. The testing of the adder begins at step 1201 with the choice of a unique permutation of the d−1 bit i and j. Since i and j each contain d−1 independent bits, there are $2^{2(d-1)}$ unique permutations of i and j. At step 1202, a Step 1 iteration is performed.

Figure 13A:
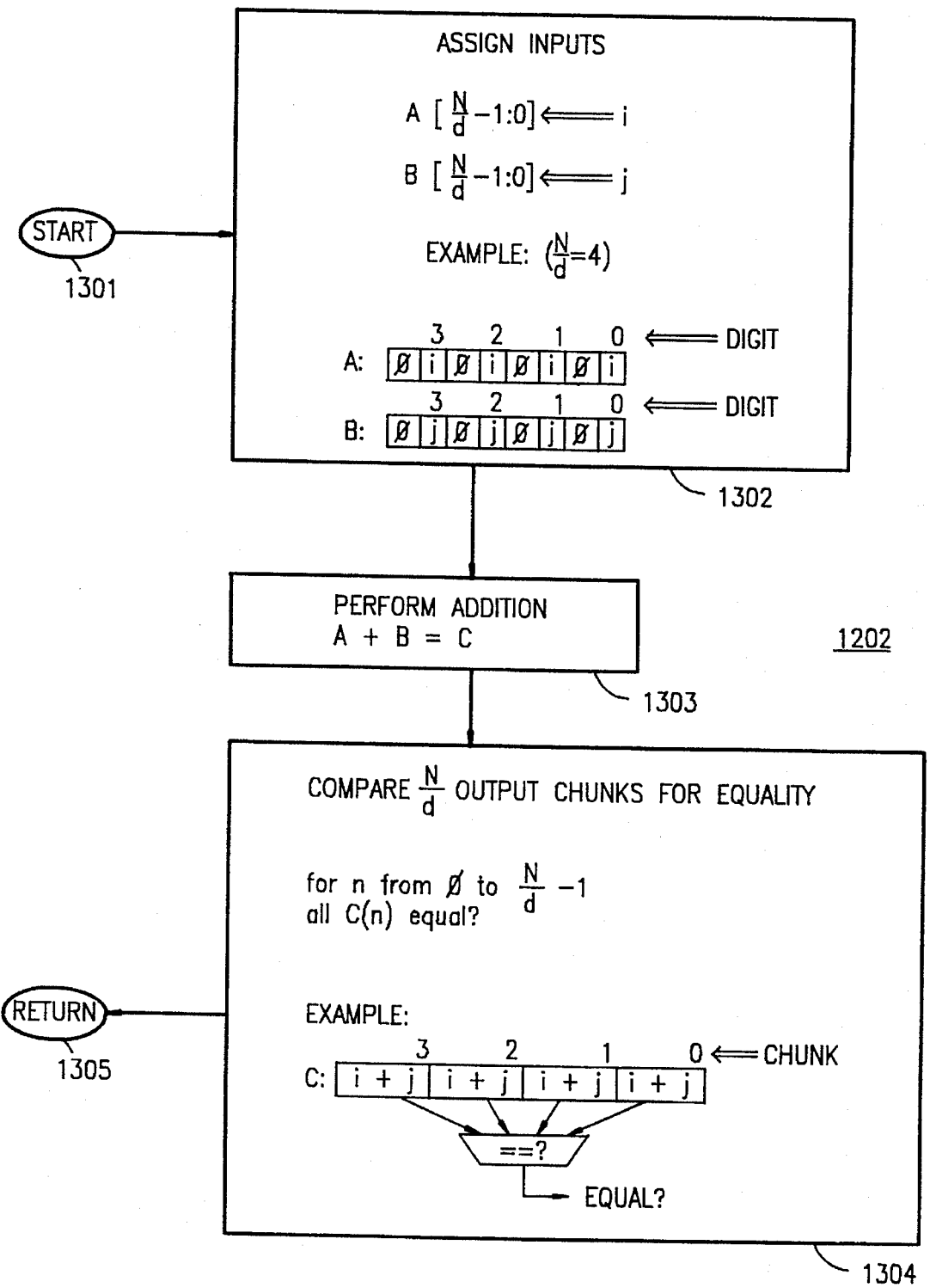
FIG. 13 is a flowchart illustrating the execution of a Step 1 iteration in the testing of an adder according to the first embodiment of the present invention.
FIG. 13B is a flowchart illustrating the execution of a Step 1 iteration in the testing of a subtractor according to the first embodiment of the present invention.

FIG. 13 is a more detailed flowchart of the method for performing a Step 1 iteration according to the present invention. The flow begins at step 1301, and the input operands A and B are assigned at Step 1302. All input operands are assigned at step 1302. All digit fields of operand A are assigned the test value of i chosen in step 1201. The d−1 bit test value of i is right justified within each digit field of operand A. All digit fields of operand B are assigned the test value of j chosen in step 1201. The d−1 bit test value of j is right justified within each digit field of operand B. Because the test values of i and j have only d−1 bits while the digit fields each have d bits, there is an extra bit in each digit field. Because the assignments of i and j are right justified, this extra bit occurs as the most significant bit of each digit field. The most significant extra bit of each digit field is assigned a zero value.

At step 1303, an addition is performed by the adder being tested by the built-in self-test method according to the present invention. At step 1304, all N/d output chunks are compared for equality. Then the flow proceeds back to FIG. 12 at branch step 1204. If branch step 1203 determines that all output chunks were not equal, the built-in self-test fails at step 1209. If step 1209 is reached, the built-in self-test can either terminate, or can continue so as to gather more data about the functionality of the adder under test. If branch step 1203 determines that all output chunks were equal, then flow proceeds to step 1204. At branch step 1204, an inquiry is made as to whether or not all unique permutations of test values i and j have been used in a Step 1 iteration. If all permutations of the test values i and j have not yet been used in a Step 1 iteration, then the flow proceeds back to step 1201 where another unused permutation of the test values i and j are selected. The loop through steps 1201, 1202, 1203, and 1204 continues until all $2^{2(d-1)}$ permutations of the test values i and j have been exhaustively used in a Step 1 iteration.

Figure 14A:
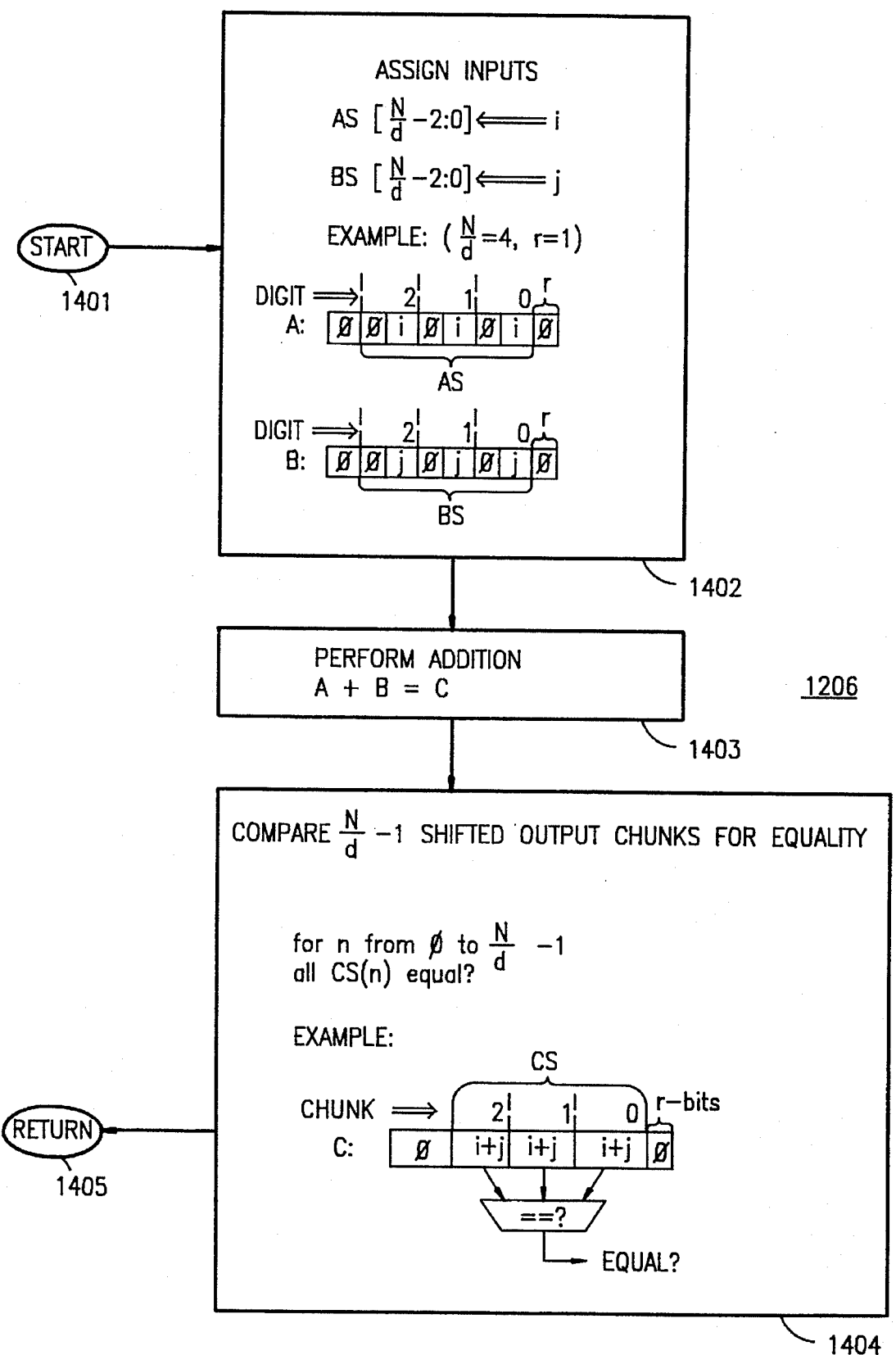
FIG. 14A is a flowchart illustrating the execution of a Step 2 iteration in the testing of an adder according to the first embodiment of the present invention.

The method then proceeds to Step 2. At step 1205, a permutation of i and j which is unused in Step 2 is selected. At step 1206, a Step 2 iteration is performed. FIG. 14 shows the details of what occurs during a Step 2 adder iteration. The procedure begins at step 1401; and at step 1402, the input operands A and B are assigned the appropriate test values. As described above in conjunction with FIG. 11, the Step 2 iteration involves Format 2 inputs and outputs 1103. In a Step 2 iteration, the least significant r bits of the adder input are reserved. The value of r is chosen within the range from 1 to d−1. In the example illustrated in FIG. 14, r is chosen to be 1, d is 3, and N/d is 4. The reserved least significant r bits are set to zero.

The most significant d−r bits of the input operands are also set to zero. Because a total of d bits of the input operands are set to zero, there are only enough bits for N/d−1 chunks among the remaining bits. In order to provide terminology such which allows a clear description of the Step 2 iteration, the remaining input bits are conceptually partitioned into N/d−1 "shifted input digits" which are aligned to the most significant of the r reserved bits. The N/d−1 shifted input digits for each of operands A and B are collectively termed AS(N/d−2:0) and BS(N/d−2:0), respectively. The shifted input operands as and BS and the d zeroed reserve bits are collectively termed input operands A and B, respectively. As shown in FIG. 14, each shifted digit 0 through N/d−2 of the input operand as is assigned the test value of i selected in step 1205. Similarly, each shifted digit 0 through N/d−2 of the input operand BS is assigned the test value of j selected in step 1205. Because i and j in the testing of an adder according to the present invention contain only d−1 bits each while the shifted digit fields are each d bits wide, there is an extra bit in each shifted digit field. The most significant bit of each shifted digit field is set to zero during the assignment step 1402, as illustrated in FIG. 14.

Once the input operands A and B are fully assigned in step 1402, the adder under test performs an addition of the number represented by input operand A and the number represented by operand B to produce the output C. In the testing of an adder according to the methods of the present invention, each of the output chunks have the same number of bits as the input digits (in contrast to the testing of a multiplier in which the each of the output chunks have twice as many bits as each of the input digits). The test values i and j for the testing of an adder or subtractor according to the present invention include one fewer bits than the input digit size, so as to provide room for carries in the case of addition, or borrowing in the case of subtraction. Therefore, the Step 2 adder output has the same partitioning as each of the input operands A and B.

In step 1404, the N/d−1 shifted output chunks CS(N/d−2:0) are tested for equality. Although each of the test values for i and j has only d−1 bits, the shifted output chunks CS(N/d−2:0) each have d bits. This is a result of the fact that the addition in step 1403 of a d−1 bit i and d−1 bit j can result in a d bit result if a carry into a more significant digit occurs. The testing procedure returns through step 1405 to the flowchart of FIG. 12. Branch step 1207 directs the method flow according to whether or not equality was detected by the comparison which occurred in step 1404 of FIG. 14. If inequality is detected, branch step 1207 directs the method flow to reporting failure at step 1209. If equality is detected, then the method flow proceeds to branch step 1208, if all permutations of i and j have not yet been exercised during a Step 2 iteration, then the loop through steps 1205, 1206, 1207, and 1208 is repeated until either an error is detected or until all $2^{2(d-1)}$ permutations of i and j are exercised. If all permutations of i and j are exercised in Step 2 iterations without the detection of inequality at step 1404, then the built-in self-test terminates successfully, and the adder under test is deemed to have passed the built-in self-test.

A Step 1 adder iteration, as illustrated in FIG. 13, is described by the following equations.

$$A = i \cdot 2^0 + i \cdot 2^d + i \cdot 2^{2d} + \ldots + i \cdot 2^{N-2d} + i \cdot 2^{N-d}$$

$$A = i \cdot \sum_{x=0}^{\frac{N}{d}-1} 2^{dx}$$

$$B = j \cdot 2^0 + j \cdot 2^d + j \cdot 2^{2d} + \ldots + j \cdot 2^{N-2d} + j \cdot 2^{N-d}$$

$$B = j \cdot \sum_{x=0}^{\frac{N}{d}-1} 2^{dx}$$

$$A + B = (i+j) \sum_{x=0}^{\frac{N}{d}-1} 2^{dx}$$

$$i < 2^{d-1}, j < 2^{d-1}, i+j < 2^d$$

The first and second equations above are equivalent representations of operand A as illustrated in step 1302. The third and fourth equations are representations of operand A as illustrated in step 1302. The fifth equation is a representation of the output of the adder under test as illustrated in step 1304. The final set of inequalities proves that the output chunks 1306, 1307, and 1308 shown in step 1304 can be fully represented by d bits and do have carries which extend into the next more significant chunk.

A Step 2 adder iteration, as illustrated in FIG. 14, is described by the following equations.

$$A = i \cdot 2^r + i \cdot 2^{r+d} + \ldots + i \cdot 2^{r+N-3d} + i \cdot 2^{r+N-2d}$$

$$A = i \cdot \sum_{x=0}^{\frac{N}{d}-2} 2^{dx+r}$$

$$B = j \cdot 2^r + j \cdot 2^{r+d} + \ldots + j \cdot 2^{r+N-3d} + j \cdot 2^{r+N-2d}$$

$$B = j \cdot \sum_{x=0}^{\frac{N}{d}-2} 2^{dx+r}$$

$$A + B = (i+j) \sum_{x=0}^{\frac{N}{d}-2} 2^{dx+r}$$

$$i < 2^{d-1}, j < 2^{d-1}, i+j < 2^d$$

The first and second equations above are equivalent representations of operand A as illustrated in step 1402. The third and fourth equations are representations of operand A as illustrated in step 1402. The fifth equation is a representation of the output of the adder under test as illustrated in step 1404. The final set of inequalities proves that the output chunks 1406, 1407, and 1408 shown in step 1404 can be fully represented by d bits and do have carries which extend into the next more significant chunk.

With regard to the testing of an adder, Step 1 does not test the carries across the chunk boundaries from the most significant bit of each chunk into the least significant bit of the next more significant chunk. As long as r is chosen to be within the range from 1 to d−1, the carries not tested in Step 1 as illustrated in FIG. 13 are tested in Step 2 as illustrated in FIG. 14.

The testing of an adder according to the present invention reduces the number of additions necessary to fully exercise the hardware from $2^{2N}$ additions to $2^{2d-1}$ additions.

The method of testing a subtractor according to the present invention is illustrated with reference to FIGS. 12, 13B, and 14B. The basic iterative flow is the same as described above with respect to FIG. 12 describing the testing of an adder according to the present invention. However, the Step 1 iterations performed in step 1202, and the Step 2 iterations performed in step 1206 are different when a subtractor, rather than an adder, is tested.

Figure 13B:
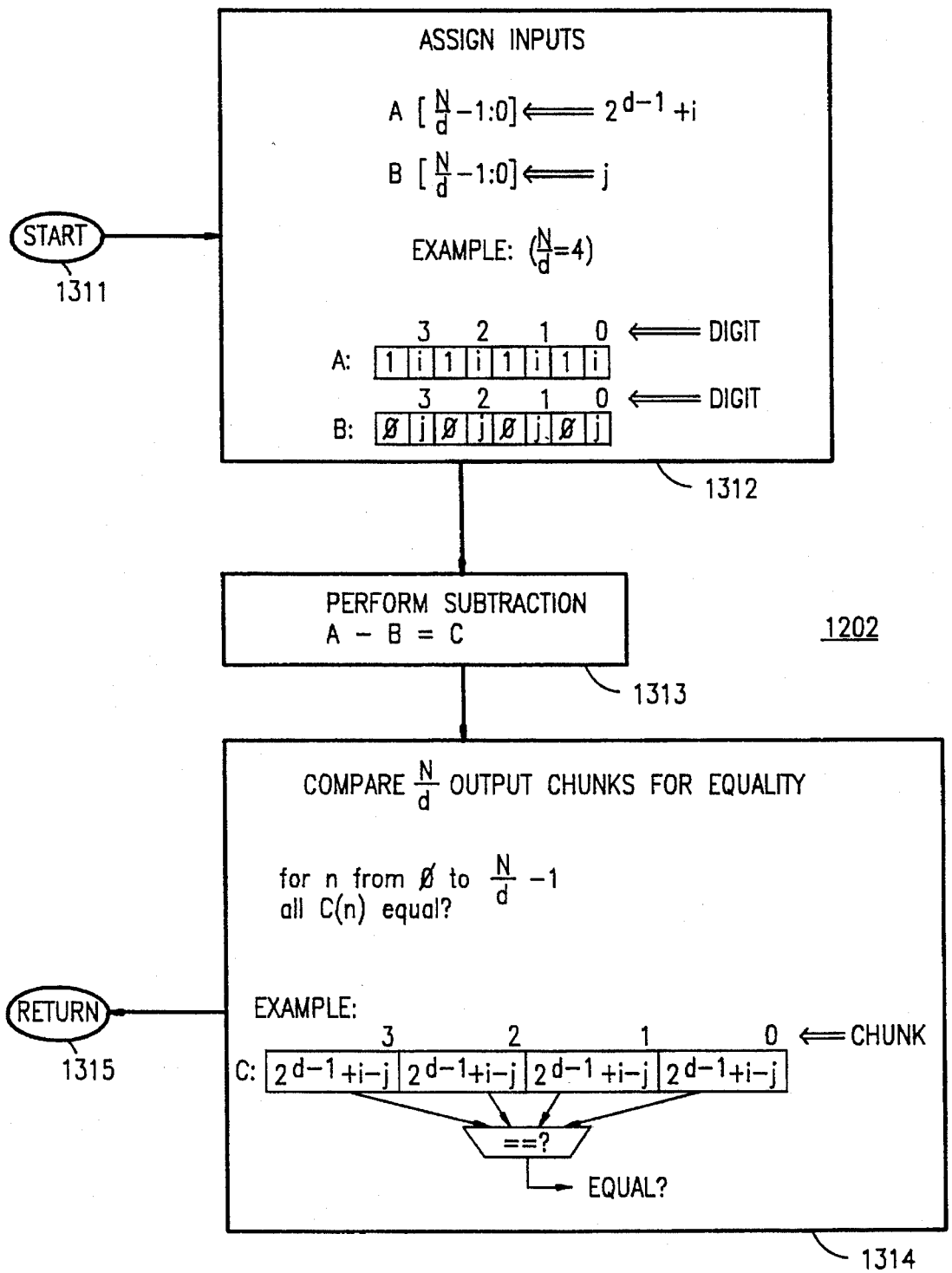

FIG. 13B illustrates the method of performing a subtractor Step 1 iteration illustrated as step 1202 in FIG. 12. The subtractor iteration starts at step 1311, and inputs are assigned at step 1312. The primary difference between an Step 1 adder iteration and a Step 2 adder iteration is in the assignment of operand A. As illustrated in the example of step 1312, the most significant bit of each of the digit fields of operand A is filled with one, while the less significant bits are filled with the test value of i. This has the result that the operand A digits are filled with $2^{d-1}+i$. A subtraction is then performed at step 1313, and then the output chunks are compared for equality at step 1314. As indicated in the example shown in step 1314, the output chunks have a value of $2^{d-1}+i-j$. The flow returns at step 1315 to the flowchart depicted in FIG. 12.

Figure 14B:
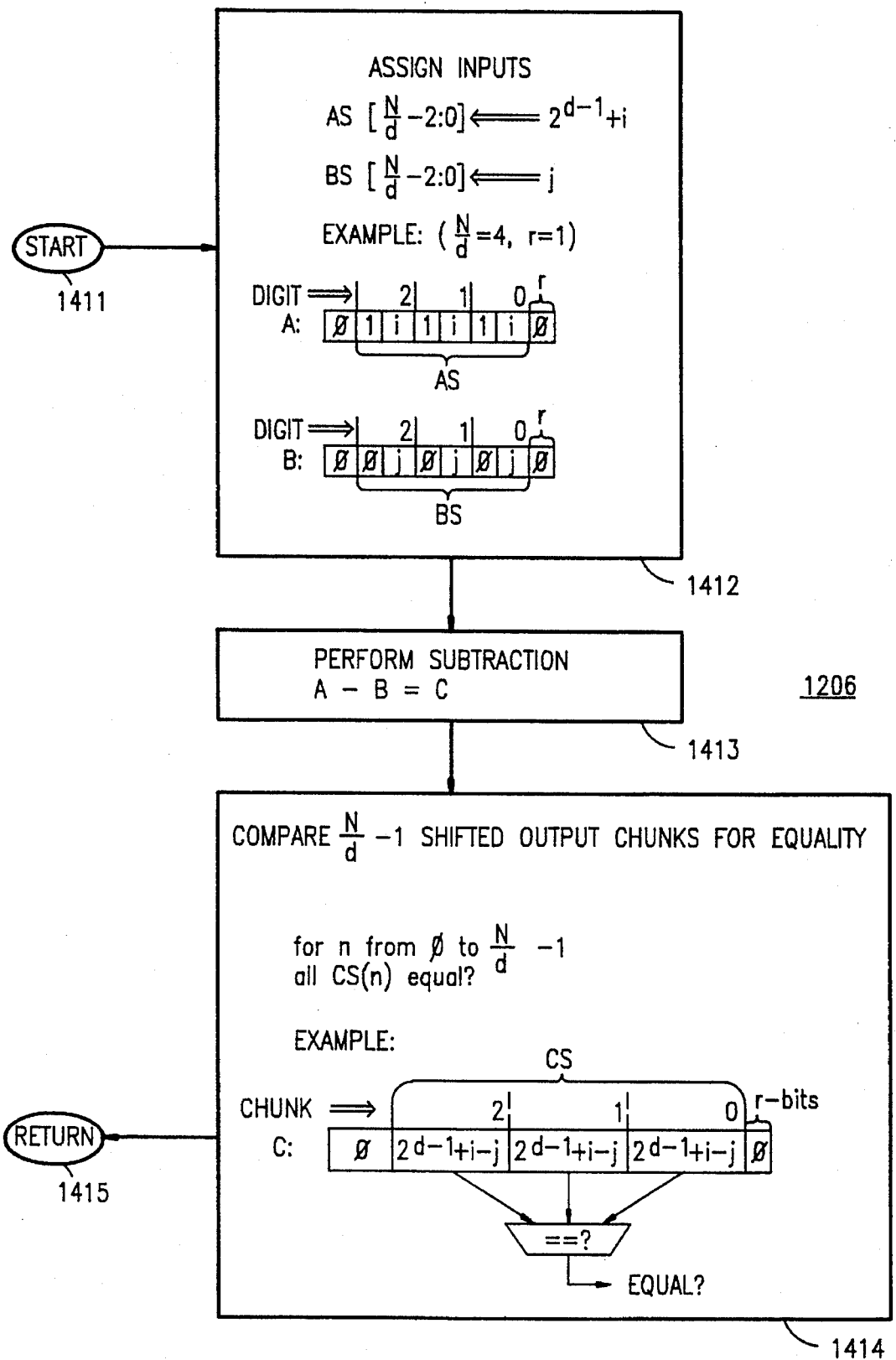
FIG. 14B is a flowchart illustrating the execution of a Step 2 iteration in the testing of a subtractor according to the first embodiment of the present invention.

FIG. 14B illustrates the method of performing a Step 2 iteration during the testing of a subtractor according to the present invention. The flowchart of FIG. 14B for the subtractor is similar to the flowchart of FIG. 14 for the adder. The only difference is that in step 1412, the input operand A is assigned differently. The most significant bit of each digit field of the shifted input digits is set to one, while the least significant digits are assigned the test value of i which was selected in step 1201. After a subtraction is perform in step 1413, the N/d−1 shifted output chunks are tested for equality at step 1415. The shifted output chunks each contain the value $2^{d-1}+i-j$. The flow returns to the FIG. 12 method at step 1415.

A Step 1 subtractor iteration, as illustrated in FIG. 13B, is described by the following equations.

$$A = (2^{d-1} + i)2^0 + (2^{d-1} + i)2^d + \ldots + (2^{d-1} + i)2^{N-2d} + (2^{d-1} + i)2^{N-d}$$

$$A = (2^{d-1} + i) \cdot \sum_{x=0}^{\frac{N}{d}-1} 2^{dx}$$

$$B = j \cdot 2^0 + j \cdot 2^d + \ldots + j \cdot 2^{N-2d} + j \cdot 2^{N-d}$$

$$B = j \cdot \sum_{x=0}^{\frac{N}{d}-1} 2^{dx}$$

$$A - B = (2^{d-1} + i - j) \cdot \sum_{x=0}^{\frac{N}{d}-1} 2^{dx}$$

The first and second above equations show the encoded number represented by operand A after assignment. The third and fourth above equations show the encoded number represented by operand B after assignment. The fifth equation above show the encoded number represented by the output C of the subtractor after the subtraction has been performed.

The following equations prove that no carries across the output chunk boundaries occur when performing any of the subtractions regardless of the relative or absolute sizes of the test values i and j.

$i<2^{d-1}$ $2^{d-1}+i<2^d$ $j\geq 0, -j\leq 0$ $2^{d-1}+i-j<2^d$

The first inequality is a consequence of the fact i is represented by d–1 bits. The second inequality is derived by adding $2^{d-1}$ to both sides of the first inequality. The third and fourth inequalities are dual representations of the fact that the test value j is an unsigned positive integer. The last inequality above is derived by adding the second and fourth inequalities above, and demonstrates that the output chunk values must be representable by d bits, thus no carries across output chunk boundaries are possible.

The equations below demonstrate that no underflow, which is essentially a carry across the least significant chunk boundary, analogous to "borrowing" from more significant digit positions in subtraction, can occur since the output chunk values are always positive.

$i\geq 0$ $2^{d-1}+i\geq 2^{d-1}$ $j<2^{d-1}, -j>-2^{d-1}$ $2^{d-1}+i-j>0$

The first inequality above is a consequence of the fact that the test value i is an unsigned positive integer. The second inequality above is derived by adding $2^{d-1}$ to both sides of the first inequality. The third an fourth inequalities above are dual representations of the fact that the test value j is represented by only d–1 bits. The last inequality above is derived by adding the second and fourth inequalities, and demonstrates that the final output chunk values must be positive.

A Step 2 subtractor iteration, as illustrated in FIG. 13B, is described by the following equations.

$A = (2^{d-1}+i)2^r + (2^{d-1}+i)2^{r+d} + \ldots +$
$\qquad (2^{d-1}+i)2^{r+N-3d} + (2^{d-1}+i)2^{r+N-2d}$ $A = (2^{d-1}+i) \cdot \sum_{x=0}^{\frac{N}{d}-2} 2^{dx+r}$ $B = j \cdot 2^r + j \cdot 2^{r+d} + \ldots + j \cdot 2^{r+N-3d} + j \cdot 2^{r+N-2d}$ $B = j \cdot \sum_{x=0}^{\frac{N}{d}-2} 2^{dx+r}$ $A - B = (2^{d-1}+i-j) \cdot \sum_{x=0}^{\frac{N}{d}-2} 2^{dx+r}$ The first and second above equations show the encoded number represented by operand A after assignment. The third and fourth above equations show the encoded number represented by operand B after assignment. The fifth equation above show the encoded number represented by the output C of the subtractor after the subtraction has been performed.

The following equations prove that no carries across the shifted output chunk boundaries occur when performing any of the subtractions regardless of the relative or absolute sizes of the test values i and j.

$i<2^{d-1}$ $2^{d-1}+i<2^d$ $j\geq 0, -j\leq 0$ $2^{d-1}+i-j<2^d$

The first inequality is a consequence of the fact i is represented by d–1 bits. The second inequality is derived by adding $2^{d-1}$ to both sides of the first inequality. The third and fourth inequalities are dual representations of the fact that the test value j is an unsigned positive integer. The last inequality above is derived by adding the second and fourth inequalities above, and demonstrates that the shifted output chunk values must be representable by d bits, thus no carries across shifted output chunk boundaries are possible.

The equations below demonstrate that no underflow, which is essentially a carry across the least significant shifted chunk boundary, analogous to "borrowing" from more significant digit positions in subtraction, can occur since the shifted output chunk values are always positive.

$i\geq 0$ $2^{d-1}+i\geq 2^{d-1}$ $j<2d-1, -j>-2^{d-1}$ $2^{d-1}+i-j>0$

The first inequality above is a consequence of the fact that the test value i is an unsigned positive integer. The second inequality above is derived by adding $2^{d-1}$ to both sides of the first inequality. The third an fourth inequalities above are dual representations of the fact that the test value j is represented by only d–1 bits. The last inequality above is derived by adding the second and fourth inequalities, and demonstrates that the final shifted output chunk values must be positive.

Figure 15:
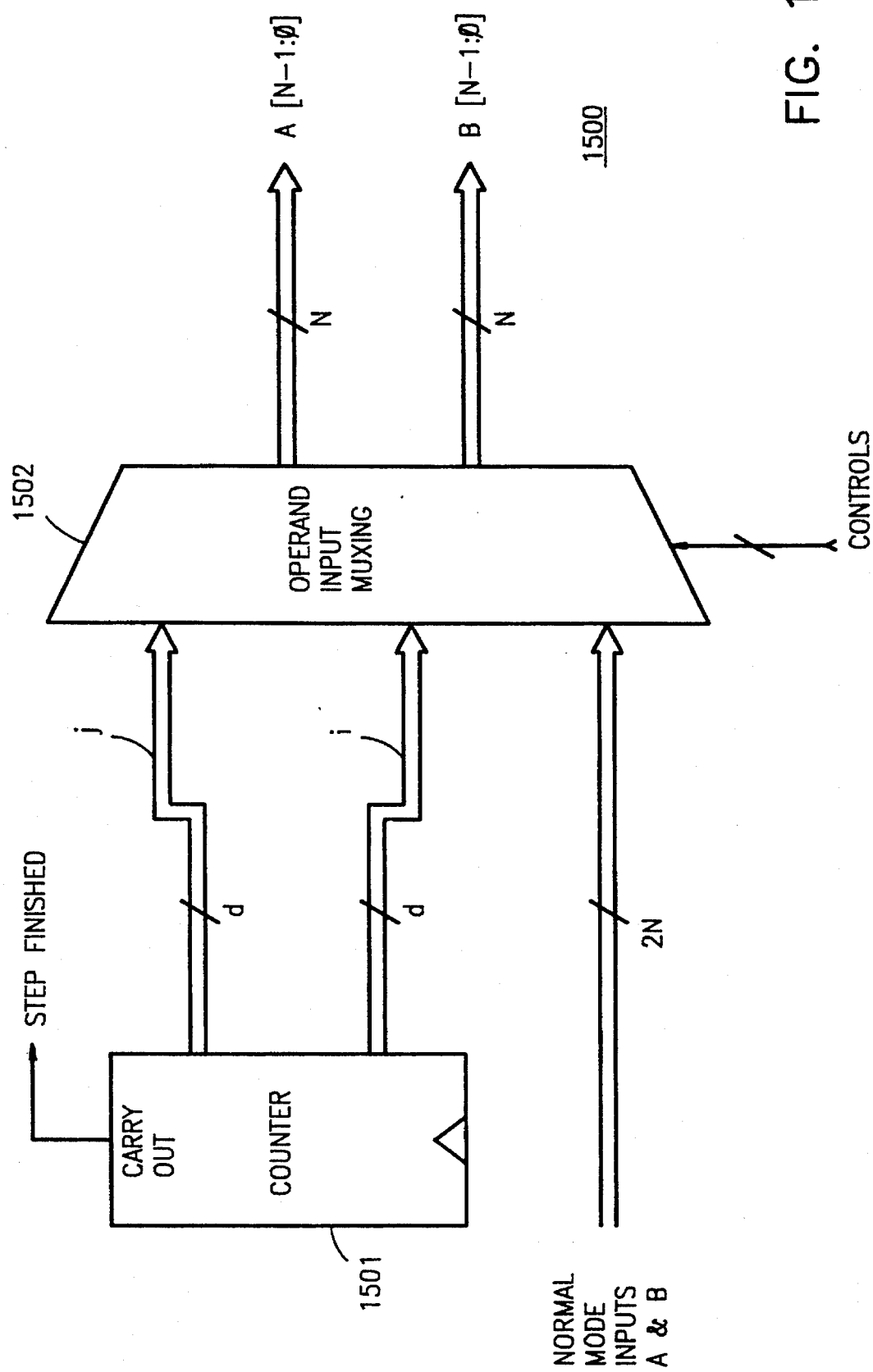
FIG. 15 is a logic diagram of a hardware test configuration suitable for use in accordance with the method of testing a multiplier or an adder according to a first embodiment of the present invention.

FIG. 15 is a logical block diagram illustrating one way of generating the test values i and j for testing a multiplier according to the present invention. The circuit 1500 includes a 2d-bit test counter 1501. The least significant d output bits of the counter are i, while the most significant d output bits of the counter are j. These counter outputs are fed into a multiplexor 1502, while the inputs for the multiplier during normal (not the built-in self-test mode) operation are supplied to the same multiplexor 1502. The actual implementation of the multiplexor 1502 is somewhat more complex than shown in FIG. 15. This is demonstrated by the fact that the multiplexor 1502 must be able to "spray" the test values for i into alternate digits of each operand A and B in each of two modes corresponding to even alternate digits and odd alternate digits. Furthermore, there must be the capability to selectively place j into the two least significant and the two most significant digits of both operands A and B. The configuration 1500 shown in FIG. 15 is suitable for a full hardware solution or a part hardware part software solution in which the inputs are not directly accessible from outside the system.

The counter 1501 can be a standard counter having a monotonically increasing output in which the first permutation of i and j is j=0 and i=0, the second permutation is j=0 and i=1, the third permutation is j=0 and i=2, etc. However, this is not an optimal implementation. During a testing scenario, the cost of the test time is generally related to the test time, such that longer test times induce higher costs. As semiconductor feature sizes become smaller, the amount of circuitry which can be implemented on a single chip becomes larger. If a chip has a large number of circuit elements, then the probability that any given fabricated unit will have a defect increases. Often, the yield (fraction of flawless dies produced on a wafer) of a modern circuit design is only 0.5 or less. Thus, there is a relatively high probability that any given die will have at least one defect. When testing each die, it is therefore desirable to find any existing defects as quickly as possible, so that a defective die can quickly be identified and removed from the tester to make room for the next die.

If a monotonically increasing or monotonically decreasing counter 1501 is used to generate the test values for i and j, then the least significant bit of i will be toggled $2^{2d}$ times before the most significant bit of j is toggled once. If there is a fault in the bit position of the operand corresponding to the most significant bit of j for a given Step, then that fault will not be discovered until half of the Step iterations have completed. In order to solve this problem, in the preferred embodiment of the present invention, a Johnson counter 1501 is used to produce the test values for i and j. A Johnson counter is a type of gray code counter which has the characteristic that its successive output values differ by only one bit position. This helps to isolate stuck-at faults, and additionally speeds the testing of all inputs, since each bit of i and j is toggled after only 2d Step iterations.

Figure 16:
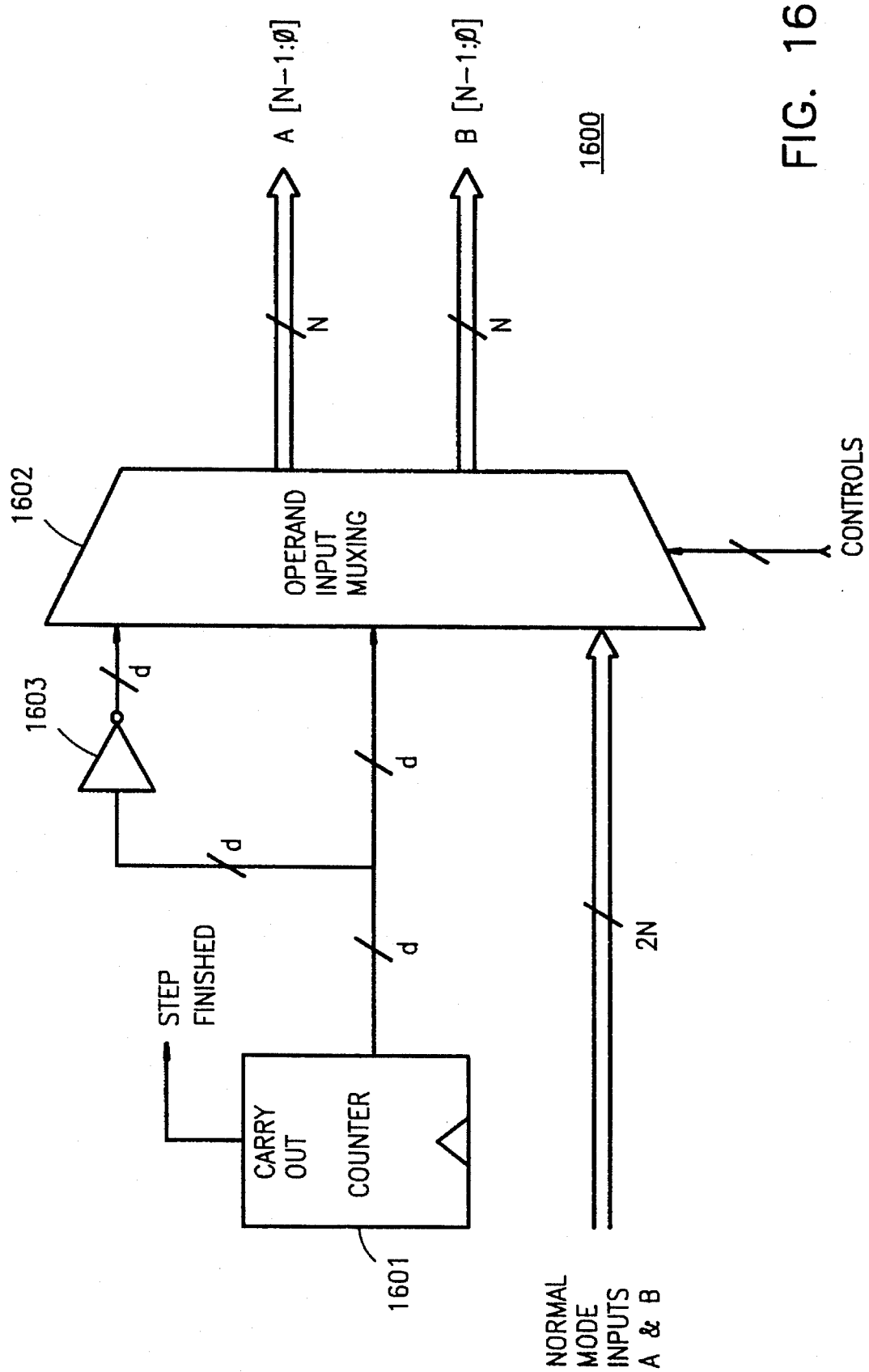
FIG. 16 is a logic diagram of a hardware test configuration suitable for use in accordance with the method of testing a multiplier or an adder according to a second embodiment of the present invention.

FIG. 16 illustrates a counter configuration which can be used to generate the test values according to the second alternative embodiment of the present invention. A d bit counter 1601 generates a test value i. An d-bit inverter column 1603 computes the one's complement of i. Both i and the one's complement of i are supplied to a complex operand input multiplexor 1602 which is identical to the multiplexor 1502 shown in FIG. 15. Each Step iteration loop takes only $2^d$ cycles. However, the test coverage is reduced because although all permutations of test value i are used, only one permutation of the other test value (the one's complement of i) are used rather than all $2^d$ permutations.

Figure 17:
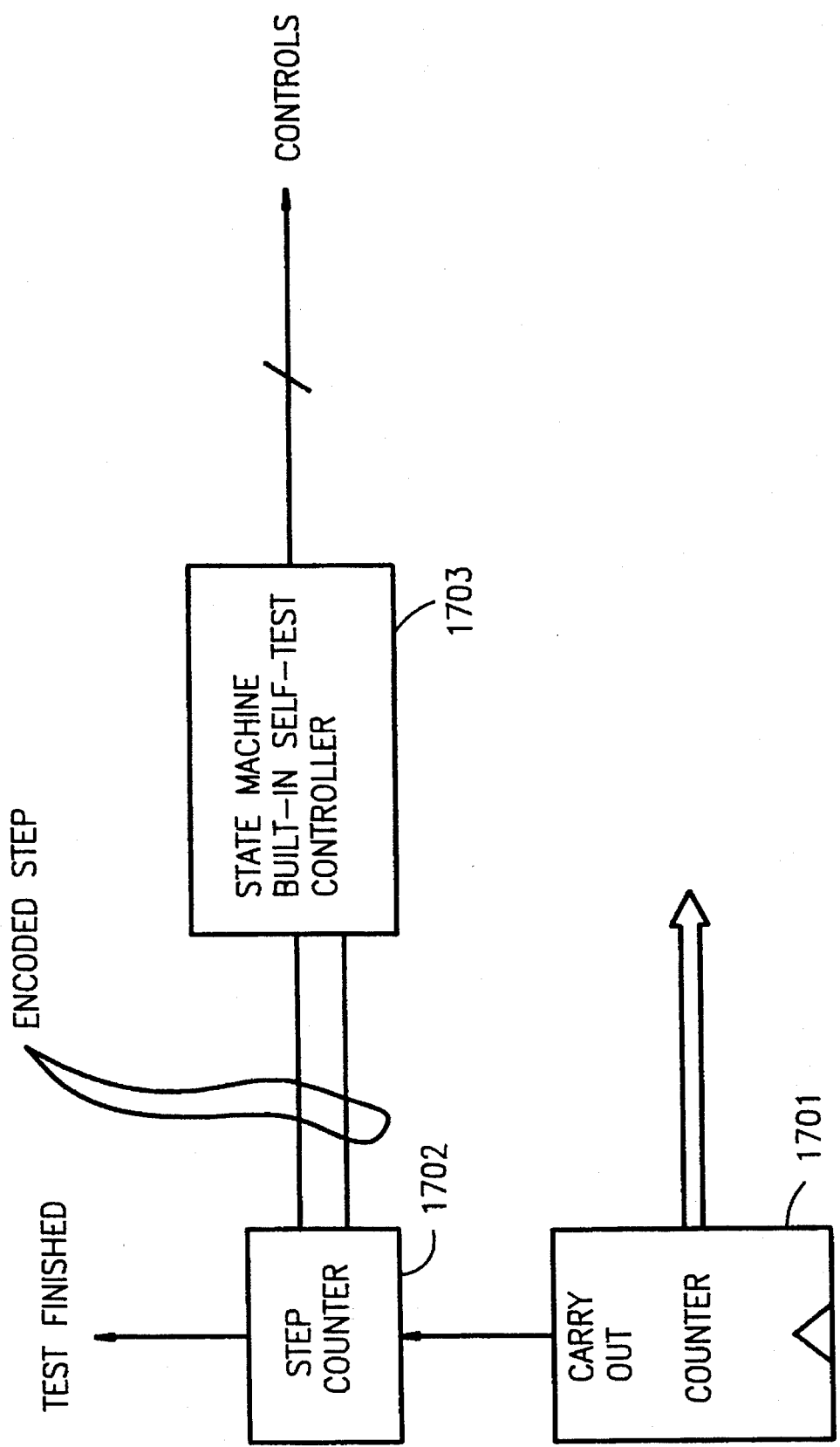
FIG. 17 is a logic diagram of a hardware test configuration suitable for use in accordance with the method of testing a multiplier according to a first or second embodiment of the present invention.

FIG. 17 illustrates the concept that the carry output of the test counter 1701 is used to advance a two-step test Step counter which produces an encoded output indicating which of the four types of Step iterations is currently being performed. A state machine controller 1703 receives the encoded Step count and produces the controls for the multiplexor 1502 (in FIG. 15) or 1602 (in FIG. 16).

While the present invention has been disclosed with particular reference to its preferred embodiments, those embodiments are presented by way of example, not by way of limitation. Those of ordinary skill in the art will be enabled by this disclosure to add to or modify the embodiments of the present invention in various ways as needed and still be within the scope and spirit of the present invention as recited in the appended claims. For example, in the above discussion and illustrations with respect to the testing of a multiplier according to the present invention, i and j are described as being assigned such that i is assigned to half the digits of one operand while j is assigned to one digit of the other operand. This allocation of i and j is arbitrary; the relative roles of i and j can be interchanged for some or all of the Steps of the testing of a multiplier according to the present invention. In a full hardware solution or a part-hardware-part-software solution in which the inputs are allocated and filled by hardware, it may be advantageous to allow i to always fill a selected operand (operand A, for example), while j always fills the other operand (operand B, for example). This allocation of i and j could possibly simplify the design of the hardware multiplexor 1502 (in FIG. 15) or 1602 (in FIG. 16).

Furthermore, the order of Steps 1, 2, 3, and 4 in the testing of the multiplier is arbitrary. The Steps can be performed in any of the 24 permutations of orderings of the Steps.

Accordingly, various changes and modifications which are obvious to a person skilled in the art to which the invention pertains are deemed to lie within the spirit and scope of the invention as claimed.

What is claimed is:

1. A method of testing a multiplier taking first and second N-bit input mantissa operands and producing a 2N-bit mantissa output, the method comprising the steps of:

selecting a digit size d, such that d evenly divides into N;

allocating each of the first and second N-bit input mantissa operands into N/d input digit fields, the input digit fields of the first operand being A(0) through A(N/d−1), the input digit fields of the second operand being B(0) through B(N/d−1);

allocating the 2N-bit mantissa output into 2N/d output subchunks each having d bits, the output subchunks being S(0) through S(2N/d−1);

for each of $2^{2d}$ permutations of integer i and integer j, wherein i and j are from the range from 0 to $2^d-1$, inclusive, loading all even digit fields A(0) through A(N/d−2) of the first operand with i;

loading all odd digit fields A(1) through A(N/d−1) of the first operand with 0;

loading the least significant digit field B(0) of the second operand with j;

loading the more significant digit fields B(1) through B(N/d−1) of the second operand with 0;

performing a multiplication;

comparing N/2d even output subchunks S(0) through S(N/d−2) for equality;

comparing N/2d odd output subchunks S(1) through S(N/d−1) for equality;

continuing if the comparing steps detected equality;

reporting test failure if either of the comparing steps detected inequality;

for each of $2^{2d}$ permutations of integer i and integer j, wherein i and j are from the range from 0 to $2^d-1$, inclusive, loading all even digit fields A(0) through A(N/d−2) of the first operand with 0;

loading all odd digit fields A(1) through A(N/d−1) of the first operand with i;

loading the most significant digit field B(N/d−1) of the second operand with j;

loading the less significant digit fields B(0) through B(N/d−2) of the second operand with 0;

performing a multiplication;

comparing N/2d even output subchunks S(N/d) through S(2N/d−2) for equality; comparing N/2d odd output subchunks S(N/d+i) through S(2N/d−1) for equality;

continuing if the comparing steps detected equality;

reporting test failure if either of the comparing steps detected inequality;

for each of $2^{2d}$ permutations of integer i and integer j, wherein i and j are from the range from 0 to $2^d-1$, inclusive, loading digit field A(1) of the first operand with j;

loading digit fields A(0) and A(2) through A(N/d−1) of the first operand with 0;

loading all even digit fields B(0) through B(N/d−2) of the second operand with 0;

loading all odd digit fields B(1) through B(N/d−1) of the second operand with i;

performing a multiplication;

comparing N/2d even output subchunks S(2) through S(N/d) for equality;

comparing N/2d odd output subchunks S(1) through S(N/d–1) for equality;
continuing if the comparing steps detected equality;
reporting test failure if either of the comparing steps detected inequality;
for each of $2^{2d}$ permutations of integer i and integer j, wherein i and j each are from the range from 0 to $2^d-1$, inclusive,
 loading digit field A(N/d–2) of the first operand with j;
 loading digit fields A(0) through A(N/d–3) and A(N/d–1) of the first operand with 0;
 loading all even digit fields B(0) through B(N/d–2) of the second operand with 0;
 loading all odd digit fields B(1) through B(N/d–1) of the second operand with i;
 performing a multiplication;
 comparing N/2d even output subchunks S(N/d) through S(2N/d–2) for equality;
 comparing N/2d odd output subchunks S(N/d–1) through S(2N/d–3) for equality;
 continuing if the comparing steps detected equality;
 reporting test failure if either of the comparing steps detected inequality; and
 reporting test passing if none of the above comparing steps detect inequality.

2. A method of testing a multiplier as in claim 1, wherein all $2^{2d}$ permutations of integers i and j are sequentially generated by a 2d-bit test counter having a test counter carry output.

3. A method of testing a multiplier as in claim 2, wherein the integer i is the least significant d output bits of the test counter; and
wherein the integer j is the most significant d bits of the test counter.

4. A method of testing a multiplier as in claim 3, wherein the 2d-bit test counter is a Johnson counter, which performs a single-bit counter output transition each increment cycle.

5. A method of testing a multiplier as in claim 3, wherein the test counter carry output enables a two-bit step counter.

6. A method of testing a multiplier as in claim 1, wherein the first and second N-bit input mantissa operands are writeable by external software, and the 2N-bit mantissa output is readable by external software, and
wherein the loading and comparing steps are performed by external software.

7. A method of testing a multiplier as in claim 1, wherein the first and second N-bit input mantissa operands are not writeable by external software, and the 2N-bit mantissa output is readable by external software, and
wherein the loading steps are performed by internal test hardware, and the comparing steps are performed by external software.

8. A method of testing a multiplier as in claim 1, wherein the first and second N-bit input mantissa operands are not writeable by external software, and the 2N-bit mantissa output is not readable by external software, and
wherein the loading and comparing steps are performed by internal test hardware.

9. A method of testing a multiplier as in claim 1, wherein N is 256; and
wherein d is 4.

10. A method of testing a multiplier taking first and second N-bit input mantissa operands and producing a 2N-bit mantissa output, the method comprising the steps of:
selecting a digit size d, such that d evenly divides into N;
allocating each of the first and second N-bit input mantissa operands into N/d input digit fields, the input digit fields of the first operand being A(0) through A(N/d–1), the input digit fields of the second operand being B(0) through B(N/d–1);
allocating the 2N-bit mantissa output into 2N/d output subchunks each having d bits, the output subchunks being S(0) through S(2N/d–1);
for each of $2^d$ values of integer i, wherein i takes on values in the range of 0 to $2^d-1$, inclusive,
 loading all even digit fields A(0) through A(N/d–2) of the first operand with i;
 loading all odd digit fields A(1) through A(N/d–1) of the first operand with 0;
 loading the least significant digit field B(0) of the second operand with the one's complement of i;
 loading the more significant digit fields B(1) through B(N/d–1) of the second operand with 0;
 performing a multiplication;
 comparing N/2d even output subchunks S(0) through S(N/d–2) for equality;
 comparing N/2d odd output subchunks S(1) through S(N/d–1) for equality;
 continuing if the comparing steps detected equality;
 reporting test failure if either of the comparing steps detected inequality;
for each of $2^d$ values of integer i, wherein i is in the range from 0 to $2^d-1$, inclusive,
 loading all even digit fields A(0) through A(N/d–2) of the first operand with 0;
 loading all odd digit fields A(1) through A(N/d–1) of the first operand with i;
 loading the most significant digit field B(N/d–1) of the second operand with the one's complement of i;
 loading the less significant digit fields B(0) through B(N/d–2) of the second operand with 0;
 performing a multiplication;
 comparing N/2d even output subchunks S(N/d) through S(2N/d–2) for equality;
 comparing N/2d odd output subchunks S(N/d+1) through S(2N/d–1) for equality;
 continuing if the comparing steps detected equality;
 reporting test failure if either of the comparing steps detected inequality;
for each of $2^d$ values of integer i, wherein i is in the range from 0 to $2^d-1$, inclusive,
 loading digit field A(1) of the first operand with the one's complement of i;
 loading digit fields A(0) and A(2) through A(N/d–1) of the first operand with 0;
 loading all even digit fields B(0) through B(N/d–2) of the second operand with 0;
 loading all odd digit fields B(1) through B(N/d–1) of the second operand with i;
 performing a multiplication;
 comparing N/2d even output subchunks S(2) through S(N/d) for equality;
 comparing N/2d odd output subchunks S(1) through S(N/d–1) for equality;
 continuing if the comparing steps detected equality;
 reporting test failure if either of the comparing steps detected inequality;

for each of $2^d$ values of integer i, wherein i is in the range from 0 to $2^d-1$, inclusive, loading digit field A(N/d–2) of the first operand with the one's complement of i;

loading digit fields A(0) through A(N/d–3) and A(N/d–1) of the first operand with 0;

loading all even digit fields B(0) through B(N/d–2) of the second operand with 0;

loading all odd digit fields B(1) through B(N/d–1) of the second operand with i;

performing a multiplication;

comparing N/2d even output subchunks S(N/d) through S(2N/d–2) for equality;

comparing N/2d odd output subchunks S(N/d–1) through S(2N/d–3) for equality;

continuing if the comparing steps detected equality;

reporting test failure if either of the comparing steps detected inequality; and reporting test passing if none of the above comparing steps detect inequality.

11. A method of testing a multiplier as in claim 10, wherein $2^d$ permutations of integers i and the one's complement of i are sequentially generated by a d-bit test counter having a test counter carry output.

12. A method of testing a multiplier as in claim 11, wherein the integer i is the output bits of the test counter; and wherein the one's complement of i is the logical inverse of the output bits of the test counter.

13. A method of testing a multiplier as in claim 12, wherein the d-bit test counter is a Johnson counter, which performs a single-bit counter output transition each increment cycle.

14. A method of testing a multiplier as in claim 12, wherein the test counter carry output enables a two-bit step counter.

15. A method of testing a multiplier as in claim 10, wherein the first and second N-bit input mantissa operands are not writeable by external software, and the 2N-bit mantissa output is readable by external software, and wherein the loading steps are performed by internal test hardware, and the comparing steps are performed by external software.

16. A method of testing a multiplier as in claim 10, wherein the first and second N-bit input mantissa operands are not writeable by external software, and the 2N-bit mantissa output is not readable by external software, and wherein the loading and comparing steps are performed by internal test hardware.

17. A method of testing a multiplier as in claim 10, wherein N is 256; and wherein d is 4.

18. A method of testing an adder taking first and second N-bit input operands and producing an N-bit output, the method comprising the steps of:

selecting a digit size d, such that d evenly divides into N;

allocating each of the first and second N-bit input operands into N/d input digit fields, the input digit fields of the first operand being A(0) through A(N/d–1), the input digit fields of the second operand being B(0) through B(N/d–1);

allocating the N-bit output into N/d output chunks each having d bits, the output chunks being C(0) through C(N/d–1);

for each of $2^{2(d-1)}$ permutations of d–1-bit integer i and d–1-bit integer j, wherein i and j are from the integer range from 0 to $2^{d-1}-1$, inclusive, loading the less significant d–1 bits of all digit fields A(0) through A(N/d–1) of the first operand with i;

loading the most significant bit of all digit fields A(0) through A(N/d–1) of the first operand with 0;

loading the less significant d–1 bits of all digit fields B(0) through B(N/d–1) of the second operand with j;

loading the most significant bit of all digit fields B(0) through B(N/d–1) of the second operand with 0;

performing an addition;

comparing the N/d output chunks C(0) through C(N/d–1) for equality;

continuing if the comparing step detected equality;

reporting test failure if the comparing step detected inequality; reserving r least significant bits in each of the first and second input operands and the N-bit output, r being in from the range from 1 to d–1, inclusive, the r least significant bits being set to zero, thereby defining first and second N-r bit shifted input operands and an N-r bit shifted output;

allocating each of the first and second N-r bit shifted input operands into N/d–1 shifted input digit fields, the shifted input digit fields of the first shifted operand being AS(0) through AS(N/d–2), the shifted input digit fields of the second shifted operand being BS(0) through BS(N/d–2);

allocating the N-r bit shifted output into N/d–1 shifted output chunks each having d–1 bits, the shifted output chunks being CS(0) through CS(N/d–2);

for each of $2^{2(d-1)}$ permutations of d–1-bit integer i and d–1-bit integer j, wherein i and j are from the integer range from 0 to $2^{d-1}$, inclusive, loading the less significant d–1 bits of all digit fields AS(0) through AS(N/d–1) of the first shifted operand with i;

loading the most significant bit of all digit fields AS(0) through AS(N/d–1) of the first shifted operand with 0;

loading the less significant d–1 bits of all digit fields BS(0) through BS(N/d–1) of the second shifted operand with j;

loading the most significant bit of all digit fields BS(0) through BS(N/d–1) of the second shifted operand with 0;

performing an addition;

comparing the N/d–1 shifted output chunks CS(0) through CS(N/d–2) for equality;

continuing if the comparing step detected equality;

reporting test failure if the comparing step detected inequality; and reporting test passing if none of the above comparing steps detect inequality.

19. A method of testing an adder as in claim 18, wherein all $2^{2(d-1)}$ permutations of integers i and j are sequentially generated by a 2(d–1) bit test counter having a test counter carry output.

20. A method of testing an adder as in claim 19, wherein the integer i is the least significant d–1 output bits of the test counter; and wherein the integer j is the most significant d–1 bits of the test counter.

21. A method of testing an adder as in claim 20, wherein the 2(d–1) bit test counter is a Johnson counter, which performs a single-bit counter output transition each increment cycle.

22. A method of testing an adder as in claim 20,
wherein the test counter carry output enables a one-bit step counter.

23. A method of testing an adder as in claim 18,
wherein the first and second N-bit input operands are writeable by external software, and the N-bit output is readable by external software, and
wherein the loading and comparing steps are performed by external software.

24. A method of testing an adder as in claim 18,
wherein the first and second N-bit input operands are not writeable by external software, and the N-bit output is readable by external software, and
wherein the loading steps are performed by internal test hardware, and the comparing steps are performed by external software.

25. A method of testing an adder as in claim 18,
wherein the first and second N-bit input operands are not writeable by external software, and the N-bit output is not readable by external software, and
wherein the loading and comparing steps are performed by internal test hardware.

26. A method of testing an adder as in claim 18,
wherein N is 256; and
wherein d is 4.

27. A method of testing an adder as in claim 18,
wherein r is 1.

28. A method of testing an adder as in claim 18,
wherein r is d-1.

29. A method of testing an adder taking first and second N-bit input operands and producing an N-bit output, the method comprising the steps of:

selecting a digit size d, such that d evenly divides into N;

allocating each of the first and second N-bit input operands into N/d input digit fields, the input digit fields of the first operand being A(0) through A(N/d-1), the input digit fields of the second operand being B(0) through B(N/d-1);

allocating the N-bit output into N/d output chunks each having d bits, the output chunks being C(0) through C(N/d-1);

for each of $2^{d-1}$ permutations of d-1-bit integer i, wherein i is from the integer range from 0 to $2^{d-1}$-1, inclusive,
loading the less significant d-1 bits of all digit fields A(0) through A(N/d-1) of the first operand with i;
loading the most significant bit of all digit fields A(0) through A(N/d-1) of the first operand with 0;
loading the less significant d-1 bits of all digit fields B(0) through B(N/d-1) of the second operand with the one's complement of
i;
loading the most significant bit of all digit fields B(0) through B(N/d-1) of the second operand with 0;
performing an addition;
comparing the N/d output chunks C(0) through C(N/d-1) for equality;
continuing if the comparing step detected equality;
reporting test failure if the comparing step detected inequality;
reserving r least significant bits in each of the first and second input operands and the N-bit output, r being in from the range from 1 to d-1, inclusive, the r least significant bits being set to zero, thereby defining first and second N-r bit shifted input operands and an N-r bit shifted output;

allocating each of the first and second N-r bit shifted input operands into N/d-1 shifted input digit fields, the shifted input digit fields of the first shifted operand being AS(0) through AS(N/d-2), the shifted input digit fields of the second shifted operand being BS(0) through BS(N/d-2);

allocating the N-r bit shifted output into N/d-1 shifted output chunks each having d-1 bits, the shifted output chunks being CS(0) through CS(N/d-2);

for each of $2^{d-1}$ permutations of d-1-bit integer i, wherein i is from the integer range from 0 to $2^{d-1}$-1, inclusive,
loading the less significant d-1 bits of all digit fields AS(0) through AS(N/d-1) of the first shifted operand with i;
loading the most significant bit of all digit fields AS(0) through AS(N/d-1) of the first shifted operand with 0;
loading the less significant d-1 bits of all digit fields BS(0) through BS(N/d-1) of the second shifted operand with the one's complement of i;
loading the most significant bit of all digit fields BS(0) through BS(N/d-1) of the second shifted operand with 0;
performing an addition;
comparing the N/d-1 shifted output chunks CS(0) through CS(N/d-2) for equality;
continuing if the comparing step detected equality;
reporting test failure if the comparing step detected inequality; and
reporting test passing if none of the above comparing steps detect inequality.

30. A method of testing an adder as in claim 29,
wherein $2^{d-1}$ permutations of integer i and the one's complement of i are sequentially generated by a d-1-bit test counter having a test counter carry output.

31. A method of testing an adder as in claim 30,
wherein the integer i is the output bits of the test counter; and
wherein the one's complement of i is the logical inverse of the output bits of the test counter.

32. A method of testing an adder as in claim 31,
wherein the d-1-bit test counter is a Johnson counter, which performs a single-bit counter output transition each increment cycle.

33. A method of testing an adder as in claim 31,
wherein the test counter carry output enables a one-bit step counter.

34. A method of testing an adder as in claim 29,
wherein the first and second N-bit input operands are writeable by external software, and the N-bit output is readable by external software, and
wherein the loading and comparing steps are performed by external software.

35. A method of testing an adder as in claim 29,
wherein the first and second N-bit input operands are not writeable by external software, and the N-bit output is readable by external software, and
wherein the loading steps are performed by internal test hardware, and the comparing steps are performed by external software.

36. A method of testing an adder as in claim 29,
wherein the first and second N-bit input operands are not writeable by external software, and the N-bit output is not readable by external software, and
wherein the loading and comparing steps are performed by internal test hardware.

37. A method of testing an adder as in claim 29,
wherein N is 256; and
wherein d is 4.

38. A method of testing an adder as in claim 29,
wherein r is 1.

39. A method of testing an adder as in claim 29,
wherein r is d−1.

40. A method of testing a subtractor taking first and second N-bit input operands and producing an N-bit output, the method comprising the steps of:

selecting a digit size d, such that d evenly divides into N;

allocating each of the first and second N-bit input operands into N/d input digit fields, the input digit fields of the first operand being A(0) through A(N/d−1), the input digit fields of the second operand being B(0) through B(N/d−1);

allocating the N-bit output into N/d output chunks each having d bits, the output chunks being C(0) through C(N/d−1);

for each of $2^{2(d-1)}$ permutations of d−1-bit integer i and d−1-bit integer j, wherein i and j are from the integer range from 0 to $2^{d-1}-1$, inclusive, loading the less significant d−1 bits of all digit fields A(0) through A(N/d−1) of the first operand with i;

loading the most significant bit of all digit fields A(0) through A(N/d−1) of the first operand with 1;

loading the less significant d−1 bits of all digit fields B(0) through B(N/d−1) of the second operand with j;

loading the most significant bit of all digit fields B(0) through B(N/d−1) of the second operand with 0;

performing a subtraction;

comparing the N/d output chunks C(0) through C(N/d−1) for equality;

continuing if the comparing step detected equality;

reporting test failure if the comparing step detected inequality;

reserving r least significant bits in each of the first and second input operands and the N-bit output, r being in from the range from 1 to d−1, inclusive, the r least significant bits being set to zero, thereby defining first and second N−r bit shifted input operands and an N−r bit shifted output;

allocating each of the first and second N−r bit shifted input operands into N/d−1 shifted input digit fields, the shifted input digit fields of the first shifted operand being AS(0) through AS(N/d−2), the shifted input digit fields of the second shifted operand being BS(0) through BS(N/d−2);

allocating the N−r bit shifted output into N/d−1 shifted output chunks each having d−1 bits, the shifted output chunks being CS(0) through CS(N/d−2);

for each of $2^{2(d-1)}$ permutations of d−1-bit integer i and d−1-bit integer j, wherein i and j are from the integer range from 0 to $2^{d-1}-1$, inclusive, loading the less significant d−1 bits of all digit fields AS(0) through AS(N/d−1) of the first shifted operand with i;

loading the most significant bit of all digit fields AS(0) through AS(N/d−1) of the first shifted operand with 1;

loading the less significant d−1 bits of all digit fields BS(0) through BS(N/d−1) of the second shifted operand with j;

loading the most significant bit of all digit fields BS(0) through BS(N/d−1) of the second shifted operand with 0;

performing a subtraction;

comparing the N/d−1 shifted output chunks CS(0) through CS(N/d−2) for equality;

continuing if the comparing step detected equality;

reporting test failure if the comparing step detected inequality; and reporting test passing if none of the above comparing steps detect inequality.

41. A method of testing a subtractor as in claim 40,
wherein all $2^{2(d-1)}$ permutations of integers i and j are sequentially generated by a 2(d−1) bit test counter having a test counter carry output.

42. A method of testing a subtractor as in claim 41,
wherein the integer i is the least significant d−1 output bits of the test counter; and
wherein the integer j is the most significant d−1 bits of the test counter.

43. A method of testing a subtractor as in claim 42,
wherein the 2(d−1) bit test counter is a Johnson counter, which performs a single-bit counter output transition each increment cycle.

44. A method of testing a subtractor as in claim 42,
wherein the test counter carry output enables a one-bit step counter.

45. A method of testing a subtractor as in claim 40,
wherein the first and second N-bit input operands are writeable by external software, and the N-bit output is readable by external software, and
wherein the loading and comparing steps are performed by external software.

46. A method of testing a subtractor as in claim 40,
wherein the first and second N-bit input operands are not writeable by external software, and the N-bit output is readable by external software, and
wherein the loading steps are performed by internal test hardware, and the comparing steps are performed by external software.

47. A method of testing a subtractor as in claim 40,
wherein the first and second N-bit input operands are not writeable by external software, and the N-bit output is not readable by external software, and
wherein the loading and comparing steps are performed by internal test hardware.

48. A method of testing a subtractor as in claim 40,
wherein N is 256; and
wherein d is 4.

49. A method of testing a subtractor as in claim 40,
wherein r is 1.

50. A method of testing a subtractor as in claim 40,
wherein r is d−1.

51. A method of testing a subtractor taking first and second N-bit input operands and producing an N-bit output, the method comprising the steps of:

selecting a digit size d, such that d evenly divides into N;

allocating each of the first and second N-bit input operands into N/d input digit fields, the input digit fields of the first operand being A(0) through A(N/d−1), the input digit fields of the second operand being B(0) through B(N/d−1);

allocating the N-bit output into N/d output chunks each having d bits, the output chunks being C(0) through C(N/d−1);

for each of $2^{d-1}$ permutations of d−1-bit integer i, wherein i is from the integer range from 0 to $2^{d-1}-1$, inclusive, loading the less significant d−1 bits of all digit fields A(0) through A(N/d−1) of the first operand with i;

loading the most significant bit of all digit fields A(0) through A(N/d−1) of the first operand with 1;

loading the less significant d−1 bits of all digit fields B(0) through B(N/d−1) of the second operand with the one's complement of i;

loading the most significant bit of all digit fields B(0) through B(N/d−1) of the second operand with 0;

performing a subtraction;

comparing the N/d output chunks C(0) through C(N/d−1) for equality;

continuing if the comparing step detected equality;

reporting test failure if the comparing step detected inequality;

reserving r least significant bits in each of the first and second input operands and the N-bit output, r being in from the range from 1 to d−1, inclusive, the r least significant bits being set to zero, thereby defining first and second N-r bit shifted input operands and an N-r bit shifted output; allocating each of the first and second N-r bit shifted input operands into N/d−1 shifted input digit fields, the shifted input digit fields of the first shifted operand being AS(0) through AS(N/d−2), the shifted input digit fields of the second shifted operand being BS(0) through BS(N/d−2);

allocating the N-r bit shifted output into N/d−1 shifted output chunks each having d−1 bits, the shifted output chunks being CS(0) through CS(N/d−2); for each of $2^{d-1}$ permutations of d−1-bit integer i, wherein i is from the integer range from 0 to $2^{d-1}-1$, inclusive, loading the less significant d−1 bits of all digit fields AS(0) through AS(N/d−1) of the first shifted operand with i;

loading the most significant bit of all digit fields AS(0) through AS(N/d-I) of the first shifted operand with 1;

loading the less significant d−1 bits of all digit fields BS(0) through BS(N/d−1) of the second shifted operand with the one's complement of i;

loading the most significant bit of all digit fields BS(0) through BS(N/d−1) of the second shifted operand with 0;

performing a subtraction;

comparing the N/d−1 shifted output chunks CS(0) through CS(N/d−2) for equality;

continuing if the comparing step detected equality;

reporting test failure if the comparing step detected inequality; and reporting test passing if none of the above comparing steps detect inequality.

52. A method of testing a subtractor as in claim 51, wherein $2^{d-1}$ permutations of integer i and the one's complement of i are sequentially generated by a d−1-bit test counter having a test counter carry output.

53. A method of testing a subtractor as in claim 52, wherein the integer i is the output bits of the test counter; and wherein the one's complement of i is the logical inverse of the output bits of the test counter.

54. A method of testing a subtractor as in claim 53, wherein the d−1-bit test counter is a Johnson counter, which performs a single-bit counter output transition each increment cycle.

55. A method of testing a subtractor as in claim 53, wherein the test counter carry output enables a one-bit step counter.

56. A method of testing a subtractor as in claim 51, wherein the first and second N-bit input operands are writeable by external software, and the N-bit output is readable by external software, and wherein the loading and comparing steps are performed by external software.

57. A method of testing a subtractor as in claim 51, wherein the first and second N-bit input operands are not writeable by external software, and the N-bit output is readable by external software, and wherein the loading steps are performed by internal test hardware, and the comparing steps are performed by external software.

58. A method of testing a subtractor as in claim 51, wherein the first and second N-bit input operands are not writeable by external software, and the N-bit output is not readable by external software, and wherein the loading and comparing steps are performed by internal test hardware.

59. A method of testing a subtractor as in claim 51, wherein N is 256; and wherein d is 4.

60. A method of testing a subtractor as in claim 51, wherein r is 1.

61. A method of testing a subtractor as in claim 51, wherein r is d−1.

* * * * *

UNITED STATES PATENT AND TRADEMARK OFFICE
CERTIFICATE OF CORRECTION

PATENT NO. : 5,600,658
DATED : February 4, 1997
INVENTOR(S) : FAZAL UR REHMAN QURESHI It is certified that error appears in the above-indentified patent and that said Letters Patent is hereby corrected as shown below:

In Col. 20, line 52, delete "$S(N/d+i)$" and replace with --$S(N/d+1)$--.

In Col. 24, line 33, delete "$2^{d-1}$" and replace with --$2^{d-1}-1$--.

In Col. 24, line 56, delete "all$2^{2(d-1)}$" and replace with --all $2^{2(d-1)}$--.

In Col. 29, line 37, delete "$AS(N/d-l)$" and replace with --$AS(N/d-1)$--.

Signed and Sealed this

Fifteenth Day of April, 1997

Attest:

BRUCE LEHMAN

Attesting Officer     Commissioner of Patents and Trademarks